United States Patent
Shimizu et al.

(10) Patent No.: US 9,257,354 B2
(45) Date of Patent: Feb. 9, 2016

(54) WIRING SUBSTRATE, LIGHT EMITTING DEVICE, AND METHOD FOR MANUFACTURING WIRING SUBSTRATE

(71) Applicant: SHINKO ELECTRIC INDUSTRIES CO., LTD., Nagano-ken (JP)

(72) Inventors: Hiroshi Shimizu, Nagano (JP); Yasuyuki Kimura, Nagano (JP); Tadashi Arai, Nagano (JP)

(73) Assignee: Shinko Electric Industries Co., Ltd., Nagano-shi, Nagano-ken (JP)

(*) Notice: Subject to any disclaimer, the term of this patent is extended or adjusted under 35 U.S.C. 154(b) by 0 days.

(21) Appl. No.: 13/655,802

(22) Filed: Oct. 19, 2012

(65) Prior Publication Data
US 2013/0099273 A1    Apr. 25, 2013

(30) Foreign Application Priority Data
Oct. 24, 2011 (JP) .................. 2011-233288

(51) Int. Cl.
*H01L 33/62* (2010.01)
*H01L 23/14* (2006.01)
*H01L 25/075* (2006.01)
*H01L 23/498* (2006.01)
(Continued)

(52) U.S. Cl.
CPC ........ *H01L 23/142* (2013.01); *H01L 23/49894* (2013.01); *H01L 23/562* (2013.01); *H01L 25/0753* (2013.01); *H01L 24/45* (2013.01); *H01L 33/60* (2013.01); *H01L 2224/45124* (2013.01); *H01L 2224/45144* (2013.01); *H01L 2224/45147* (2013.01); *H01L 2224/48227* (2013.01); *H01L 2924/01047* (2013.01); *H01L 2924/12041* (2013.01); *H01L 2924/12042* (2013.01); *H05K 2201/09409* (2013.01)

(58) Field of Classification Search
USPC .................... 257/99, 666, 675, 692, E33.066
See application file for complete search history.

(56) References Cited

U.S. PATENT DOCUMENTS

| 2003/0038585 | A1 | 2/2003 | Watanabe et al. |
| 2007/0085944 | A1 | 4/2007 | Tanaka et al. |
| 2007/0290306 | A1* | 12/2007 | Muramatsu et al. .......... 257/678 |

(Continued)

FOREIGN PATENT DOCUMENTS

| EP | 2 071 622 A2 | 6/2009 |
| JP | 07-235618 | 9/1995 |

(Continued)

OTHER PUBLICATIONS

European Patent Office Search Report, from EP 12189184, dated Feb. 19, 2013 (6 pages).

(Continued)

*Primary Examiner* — Fernando L Toledo
*Assistant Examiner* — Lawrence-Linh T Nguyen
(74) *Attorney, Agent, or Firm* — Fish & Richardson P.C.

(57) ABSTRACT

A wiring substrate includes a substrate, a first insulating layer formed on the substrate, wiring patterns formed on a first surface of the first insulating layer, and a second insulating layer formed on the first surface of the first insulating layer. The second insulating layer covers the wiring patterns and includes a first opening that partially exposes adjacent wiring patterns as a pad. A projection is formed in an outer portion of the substrate located outward from where the first opening is arranged. The projection rises in a thickness direction of the substrate.

20 Claims, 14 Drawing Sheets

(51) Int. Cl.
  *H01L 23/00* (2006.01)
  *H01L 33/60* (2010.01)

(56) References Cited

U.S. PATENT DOCUMENTS

2009/0001404 A1* 1/2009 Ohata ............................ 257/99
2011/0240346 A1   10/2011 Kang et al.
2012/0261169 A1* 10/2012 Ishihara et al. ............... 174/255

FOREIGN PATENT DOCUMENTS

| JP | 2007-235618 | 9/1995 |
| JP | 10-270591 | 10/1998 |
| JP | 2010-270591 | 10/1998 |
| JP | 2003-092011 | 3/2003 |
| JP | 4762374 | 6/2011 |

OTHER PUBLICATIONS

Japanese Notification of Reasons for Rejection; JP Appln. No. 2011-233288; Mar. 3, 2015; 4 pp; with English Translation.

* cited by examiner

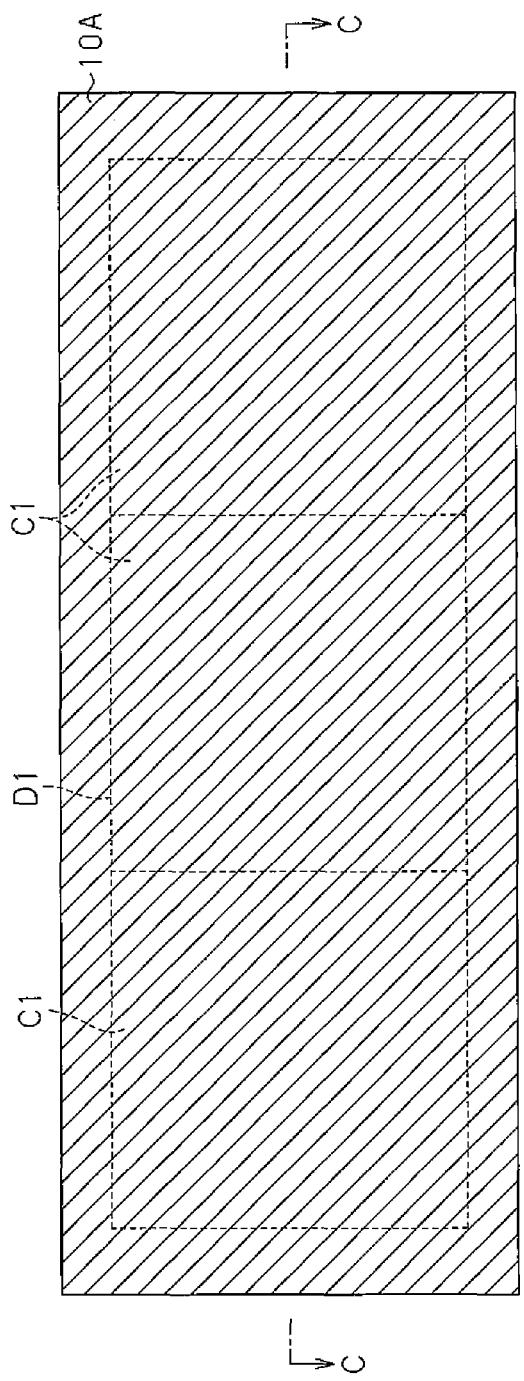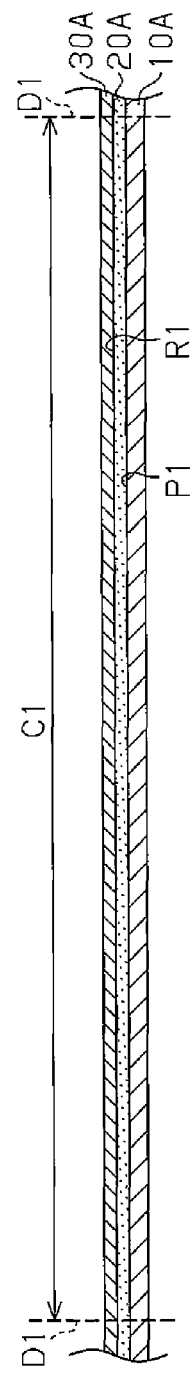

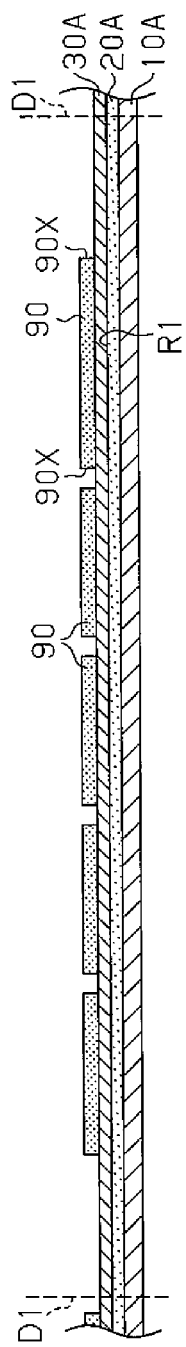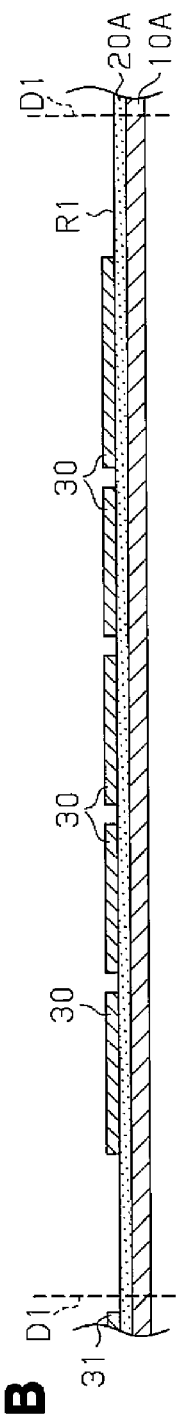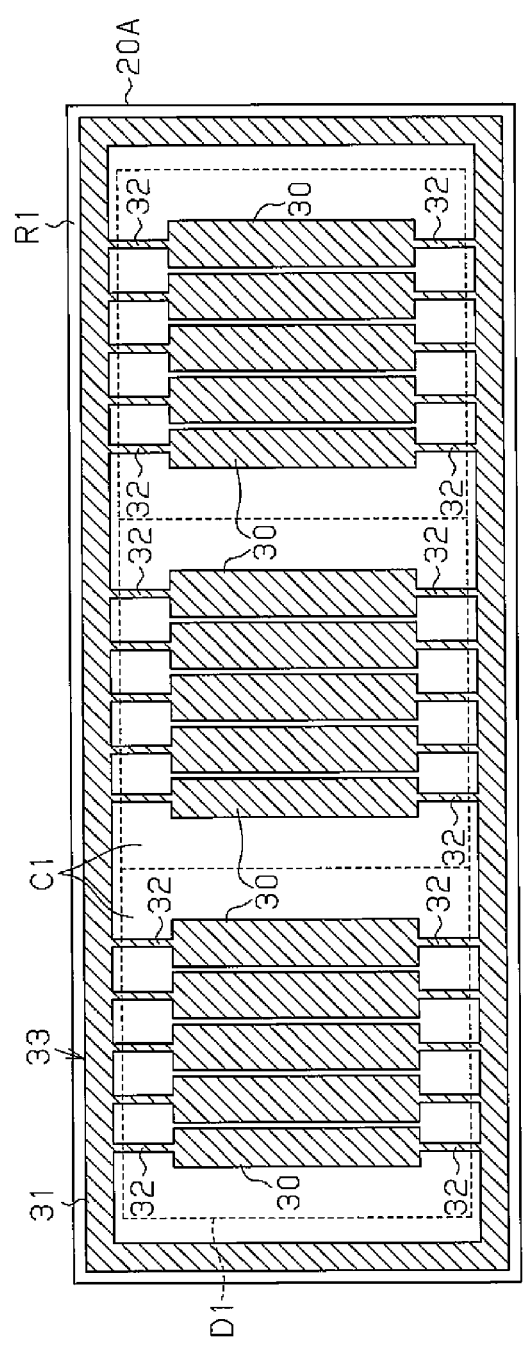

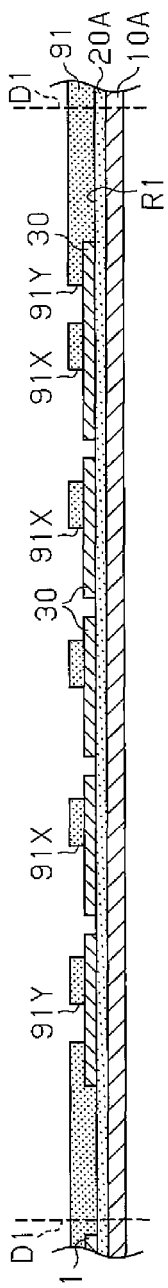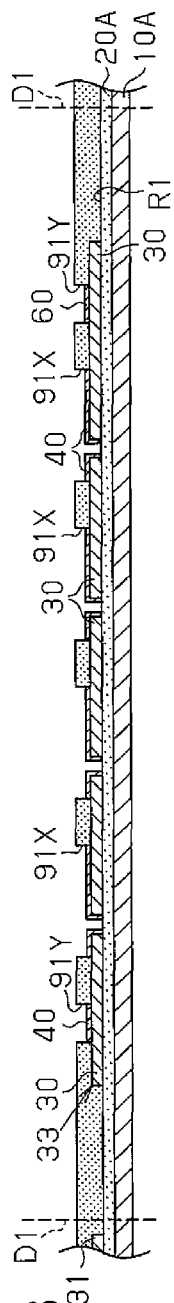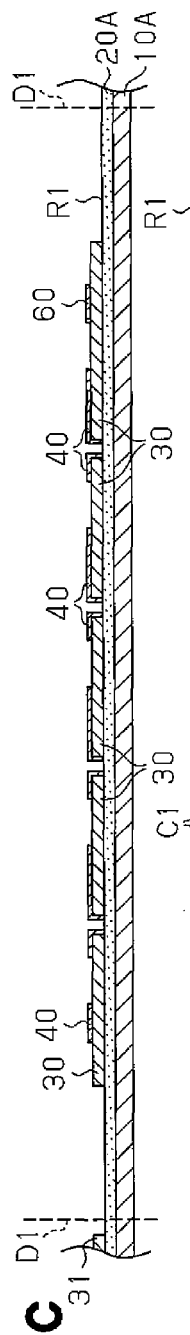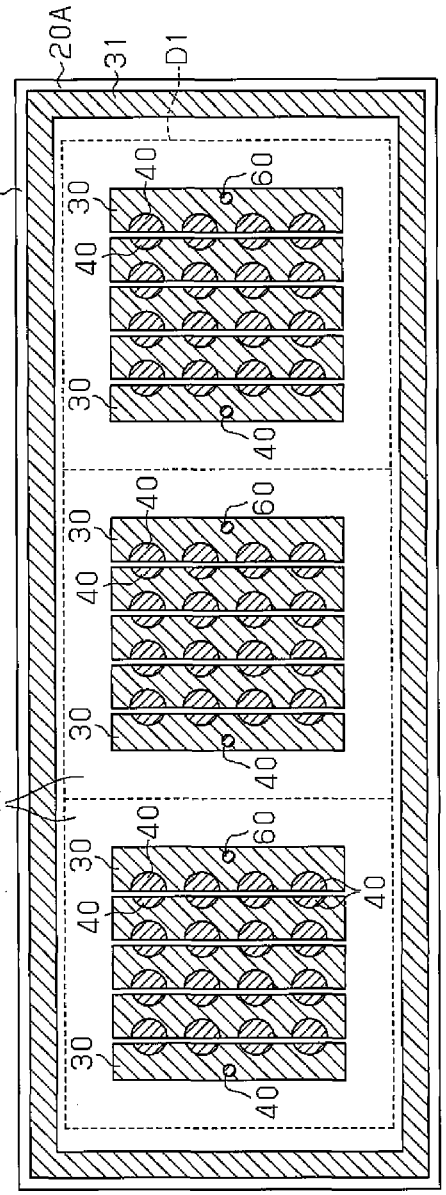

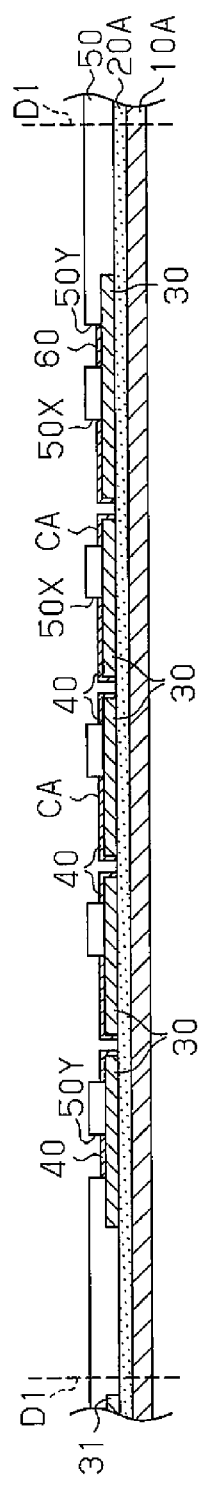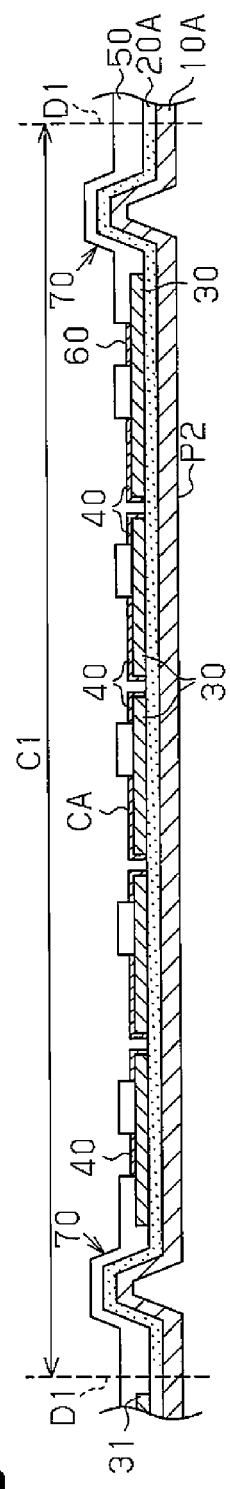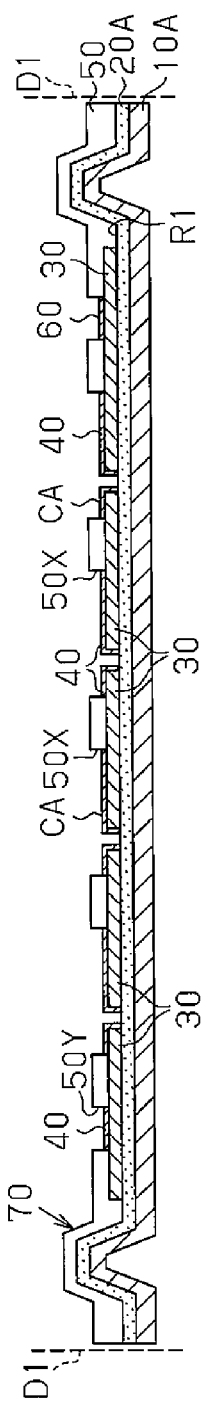

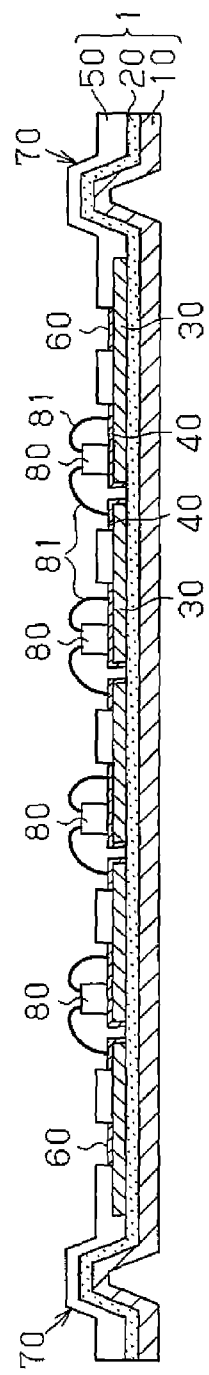
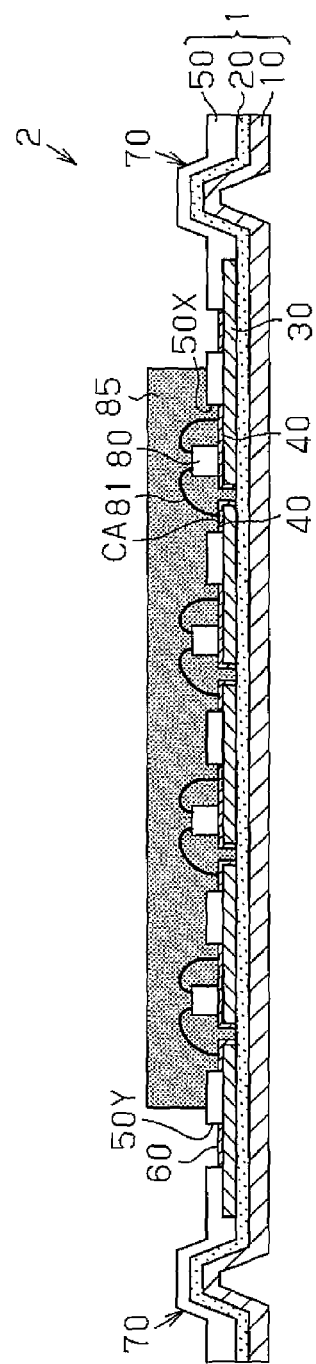
Fig.8A
Fig.8B

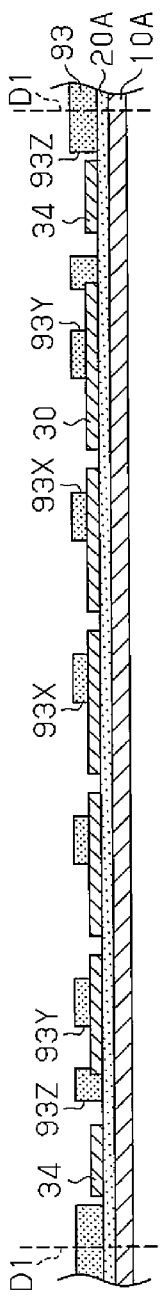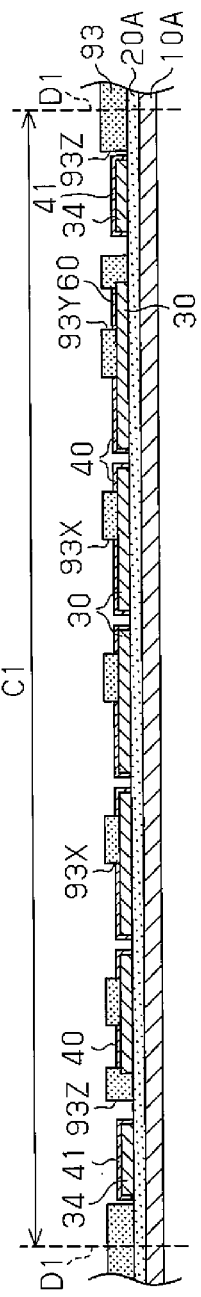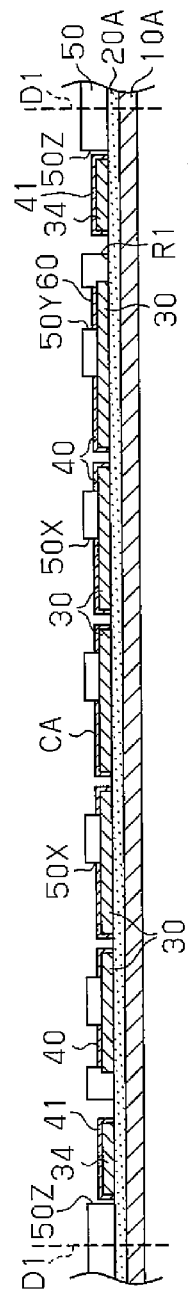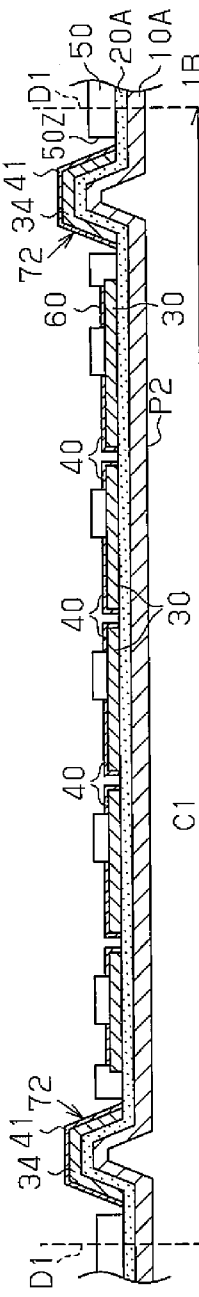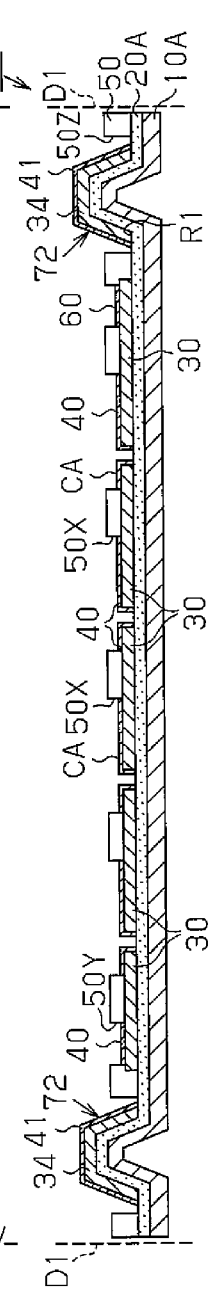

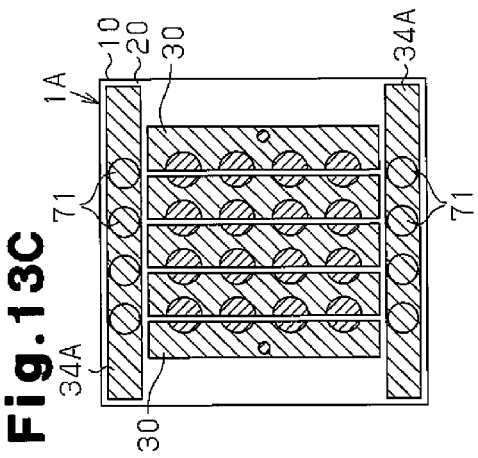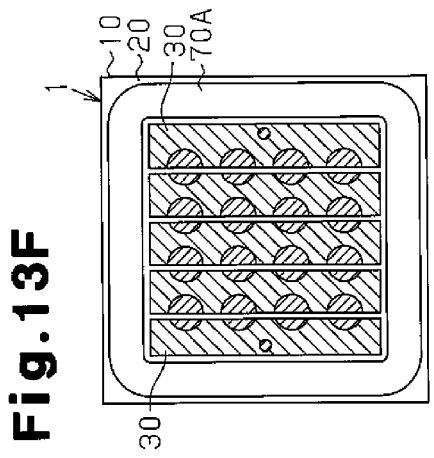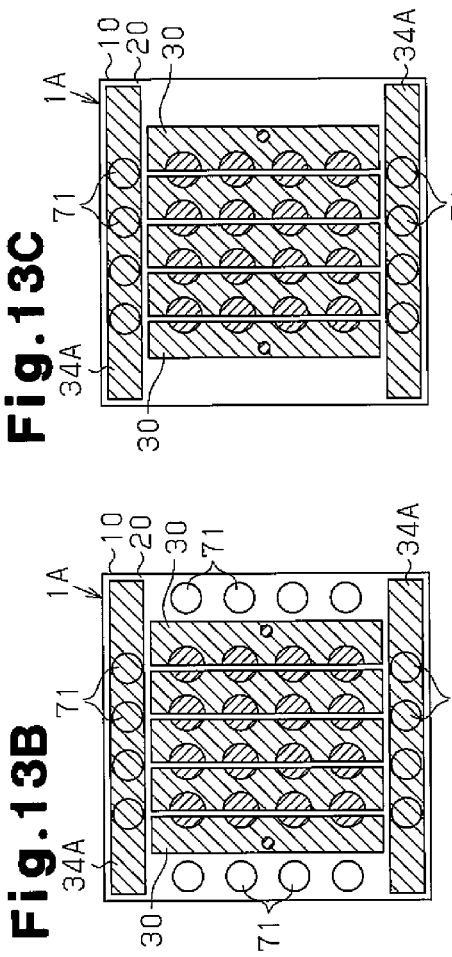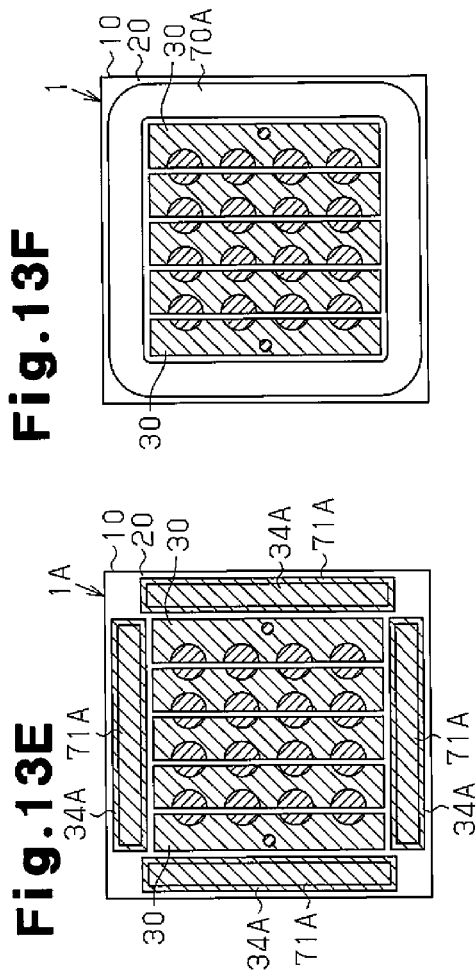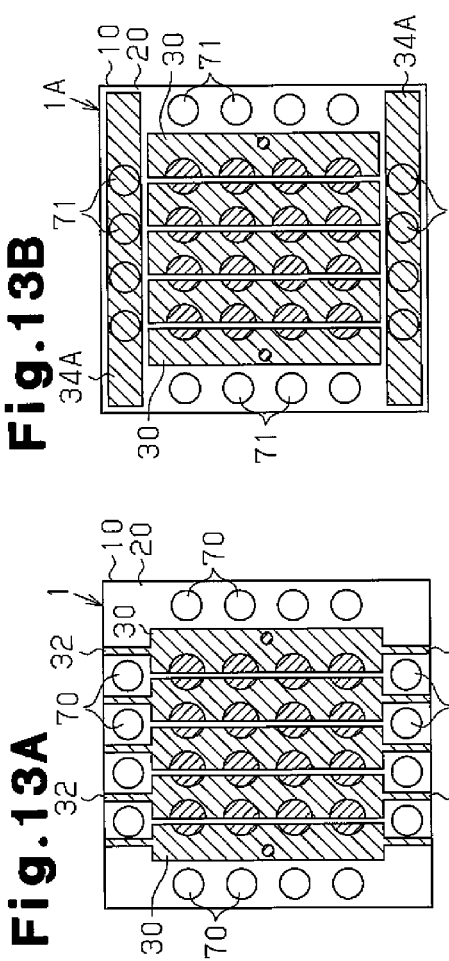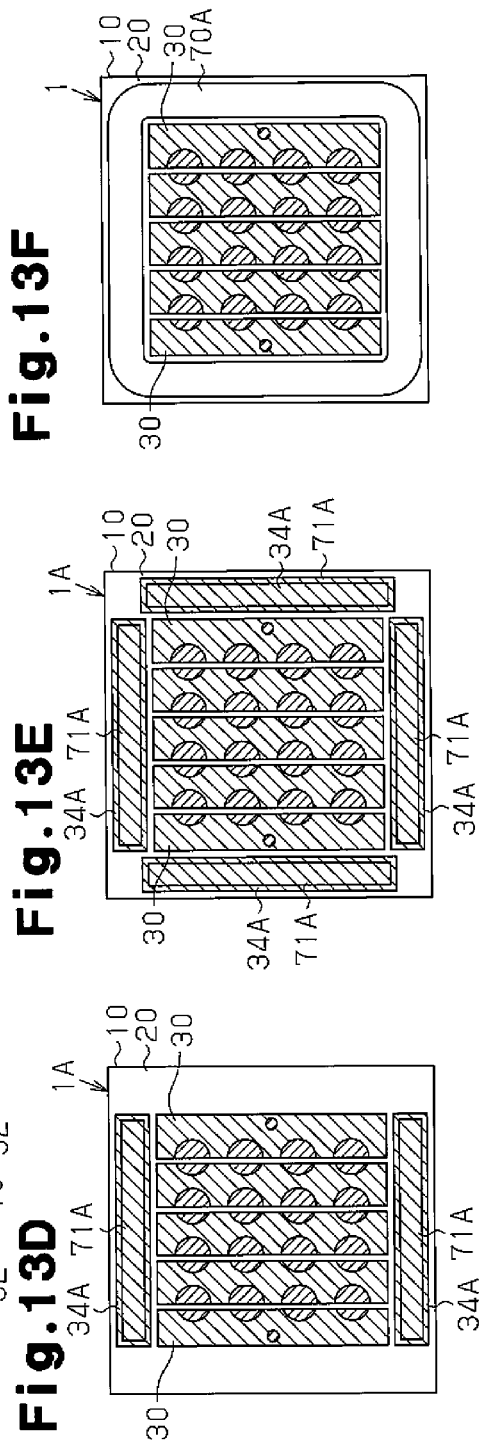

WIRING SUBSTRATE, LIGHT EMITTING DEVICE, AND METHOD FOR MANUFACTURING WIRING SUBSTRATE

CROSS-REFERENCE TO RELATED APPLICATIONS

This application is based upon and claims the benefit of priority from prior Japanese Patent Application No. 2011-233288, filed on Oct. 24, 2011, the entire contents of which are incorporated herein by reference.

FIELD

This disclosure relates to a wiring substrate, a light emitting device, and a method for manufacturing a wiring substrate.

BACKGROUND

Various light emitting devices have been proposed in the prior art. A light emitting device includes a light emitting element mounted on a substrate. Japanese Laid-Open Patent Publication No. 2003-092011 describes an example of a light emitting device in the related art. In the light emitting device, a wiring pattern is formed on an insulating layer applied to a metal substrate, and a light emitting element such as a light emitting diode (LED) is mounted on the wiring pattern.

In the above light emitting device, a thin substrate is used to increase the heat conductivity. This lowers the rigidity of the entire light emitting device. As a result, the substrate may easily be warped and deformed when heat contraction or the like occurs.

SUMMARY

One aspect of this disclosure is a wiring substrate including a substrate, a first insulating layer formed on the substrate, a plurality of wiring patterns formed on a first surface of the first insulating layer, and a second insulating layer formed on the first surface of the first insulating layer. The second insulating layer covers the wiring patterns and includes a first opening that partially exposes adjacent ones of the wiring patterns as a pad. A projection is formed in an outer portion of the substrate located outward from where the first opening is arranged. The projection rises in a thickness direction of the substrate.

Other aspects and advantages of the embodiments will become apparent from the following description, taken in conjunction with the accompanying drawings, illustrating by way of example the principles of the invention.

BRIEF DESCRIPTION OF THE DRAWINGS

The embodiments, together with objects and advantages thereof, may best be understood by reference to the following description of the presently preferred embodiments together with the accompanying drawings in which:

FIG. 4A is a schematic plan view illustrating a state of a process for manufacturing the wiring substrate of FIG. 1A;

FIG. 4B is a schematic cross-sectional view illustrating a state of the process for manufacturing the wiring substrate of FIG. 1A;

FIGS. 5A and 5B are schematic cross-sectional views illustrating states of the process for manufacturing the wiring substrate of FIG. 1A;

FIG. 5C is a schematic plan view illustrating a state of the process for manufacturing the wiring substrate of FIG. 1A;

FIGS. 6A to 6C are schematic cross-sectional views illustrating states of the process for manufacturing the wiring substrate of FIG. 1A;

FIG. 6D is a schematic plan view illustrating a state of the process for manufacturing the wiring substrate of FIG. 1A;

FIGS. 7A to 7C are schematic cross-sectional views illustrating states of the process for manufacturing the wiring substrate of FIG. 1A;

FIGS. 8A and 8B are schematic cross-sectional views illustrating states of a process for manufacturing the light emitting device of FIG. 3A;

FIGS. 12A to 12E are schematic cross-sectional views illustrating states of a process for manufacturing the wiring substrate of FIG. 11A;

FIGS. 13A to 13F are schematic plan views illustrating a modified example of a wiring substrate in a state in which an outermost insulating layer is omitted;

DESCRIPTION OF THE EMBODIMENTS

Embodiments will now be described with reference to the accompanying drawings. The accompanying drawings schematically illustrate structures and do not depict actual scale. To facilitate understanding, cross-sectional views of structures may be illustrated without hatching lines.

A first embodiment will now be described with reference to FIGS. 1 to 8.

[Structure of Wiring Substrate]

Figure 1A:
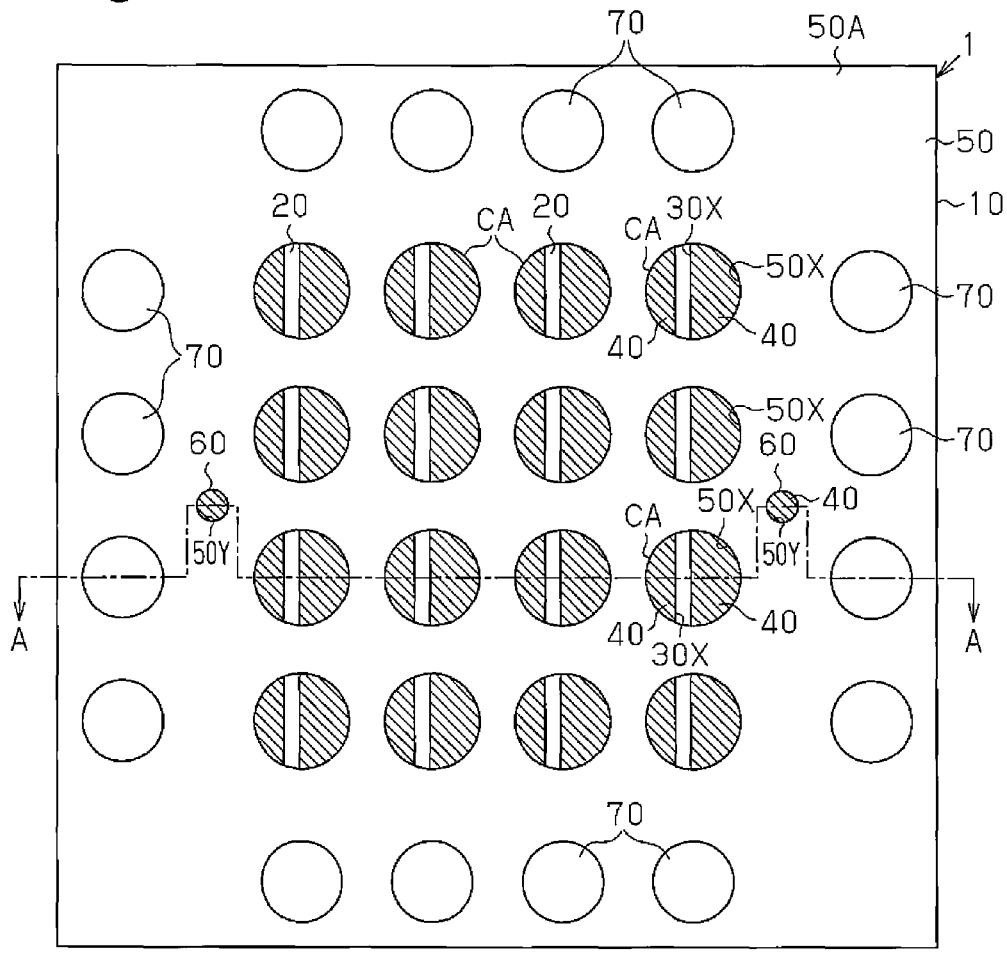
FIG. 1A is a schematic plan view illustrating a wiring substrate according to a first embodiment.
Figure 1B:
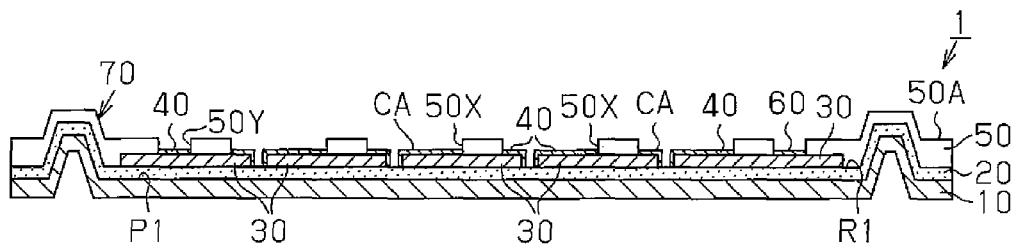
FIG. 1B is a schematic cross-sectional view of the wiring substrate taken along line A-A in FIG. 1A.

As illustrated in FIG. 1B, a wiring substrate 1 includes a substrate 10, an insulating layer 20 covering a first surface P1 of the substrate 10, wiring patterns 30 formed on the insulating layer 20, a metal layer 40 formed on parts of the wiring patterns 30, and an insulating layer 50 covering the wiring patterns 30. The wiring substrate 1 is applied to a light emitting device, for example. The insulating layer 20 is an example of a first insulating layer. The insulating layer 50 is an example of a second insulating layer.

The substrate 10 is a thin plate, and generally tetragonal as viewed from above. Examples of the material for the substrate 10 include metals having superior heat conductivity, such as copper (Cu), aluminum (Al), and iron (Fe) and alloys containing at least one of Cu, Al, and Fe. The thickness of the substrate 10 may be approximately 0.1 to 0.4 mm, for example.

The insulating layer 20 covers the entire surface of the first surface P1 of the substrate 10. Examples of the material for the insulating layer 20 are insulating resins such as a polyimide-based resin and an epoxy-based resin. Another example of the material for the insulating layer 20 is a resin material obtained by mixing fillers such as silica or alumina in an epoxy-based resin. The thickness of the insulating layer 20 may be approximately 15 to 50 μm, for example.

Figure 2:
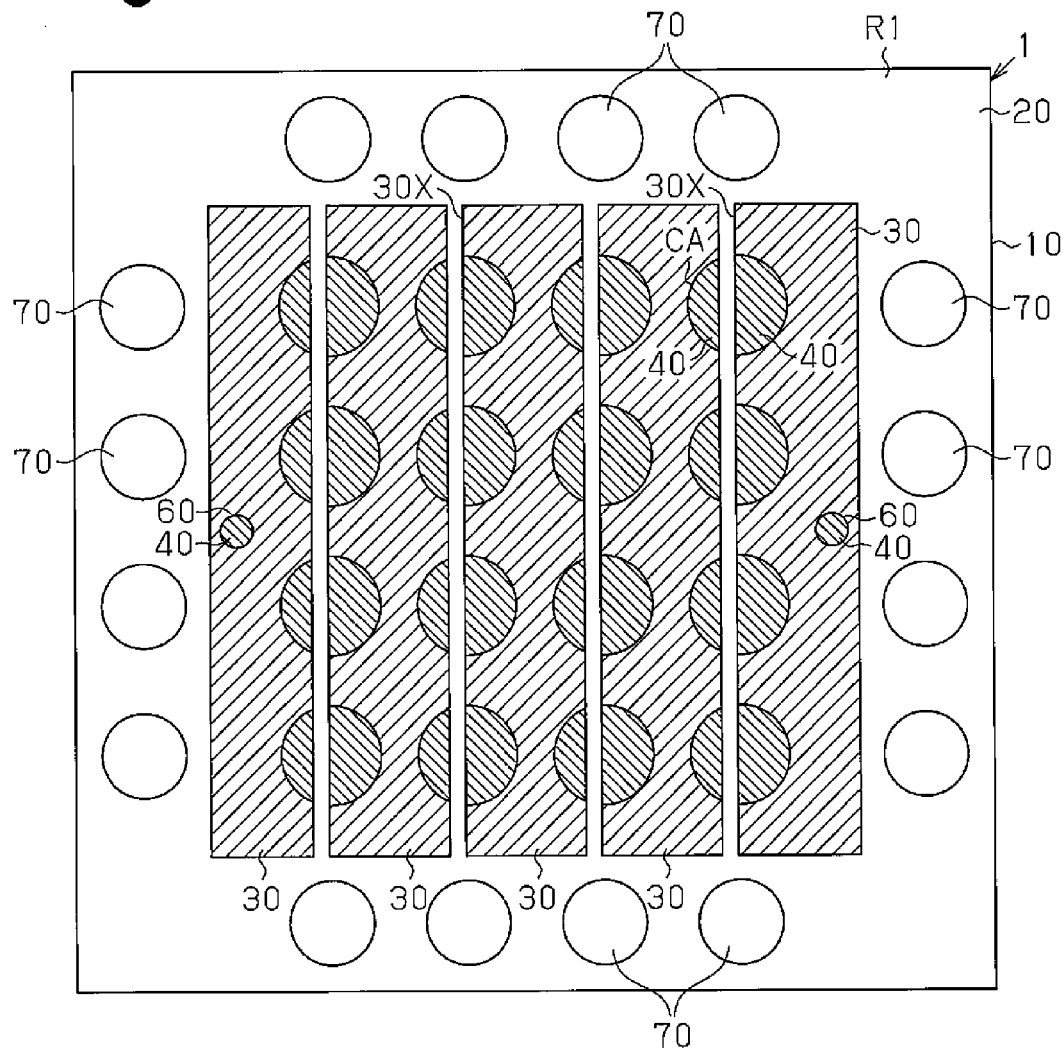
FIG. 2 is a schematic plan view illustrating wiring patterns and metal layers illustrated in FIG. 1B.

The wiring patterns 30 are formed on a first surface R1 of the insulating layer 20. As illustrated in FIG. 2, the wiring patterns 30 entirely cover a middle portion of the first surface R1 of the insulating layer 20. For example, a plurality of (five in FIG. 2) parallel wiring patterns 30 are arranged next to one another. Each wiring pattern 30 is strip-shaped, for example. Groove-shaped openings 30X that expose the underlying insulating layer 20 are formed between the adjacent wiring patterns 30. The wiring patterns 30 are separated from one another by the openings 30X. Examples of the material for the wiring pattern 30 are copper and a copper alloy. The thickness of the wiring pattern 30 may be approximately 15 to 150 μm, for example.

As illustrated in FIG. 1B, the insulating layer 50 is formed on the first surface R1 of the insulating layer 20 so as to cover parts of the wiring patterns 30. The insulating layer 50 includes openings 50X, which expose parts of the wiring patterns 30 as mounting regions CA, and openings 50Y, which expose parts of the wiring patterns 30 as electrode terminals 60. The metal layer 40 is formed on the wiring patterns 30 exposed from the openings 50X and 50Y. Examples of each metal layer 40 are a silver (Ag) layer, a nickel (Ni)/gold (Au) layer (a metal layer in which a Ni layer and an Au layer are laminated in this order from the bottom), a Ni/Ag layer (a metal layer in which a Ni layer and an Ag layer are laminated in this order from the bottom), and a Ni/palladium (Pd)/Au layer (a metal layer in which a Ni layer, a Pd layer, and an Au layer are laminated in this order from the bottom). Other examples of the metal layer 40 are a Ni/Pd/Ag layer (a metal layer in which a Ni layer, a Pd layer, and an Ag layer are laminated in this order from the bottom) and a Ni/Pd/Ag/Au layer (a metal layer in which a Ni layer, a Pd layer, an Ag layer, and an Au layer are laminated in this order from the bottom).

As illustrated in FIG. 1A, the openings 50X and 50Y are circular, for example, as viewed from above. The openings 50X are arranged in a matrix array (4×4 in FIG. 1A) on the insulating layer 20. In other words, the mounting regions CA defined by the openings 50X are arranged in a matrix array on the insulating layer 20. Each opening 50X corresponding to one of the mounting regions CA exposes the metal layer 40. The metal layer 40 is formed on two of the wiring patterns 30 and is separated by one of the groove-shaped openings 30X. The metal layer 40 exposed from each opening 50X functions as a pad.

Each opening 50Y is formed on the wiring pattern 30 outward from the openings 50X, that is, the mounting regions CA. As illustrated in FIG. 2, the metal layer 40 exposed from the openings 50Y, that is, the electrode terminals 60, are formed outward from the metal layer 40 corresponding to the mounting regions CA on the two outermost ones of the five wiring patterns 30. Each of the electrode terminals 60 is supplied with power from an external power supply by, for example, a power cable (not illustrated).

The insulating layer 50 illustrated in FIG. 1A has high reflectance. For example, the insulating layer 50 has a reflectance of 50% or higher (preferably 80% or higher) in the wavelength range of 450 nm to 700 nm. Such an insulating layer 50 is also referred to as a white resist layer. An example of a material for the insulating layer 50 that may be used is a white insulating resin. Examples of the white insulating resin that may be used are a resin material in which fillers such as white titanium oxide is mixed in an epoxy-based resin or an organo-polysiloxane-based resin, and a resin material containing a white pigment such as $TiO_2$ or $BaSO_4$. The insulating layer 50 (white resist layer) covers the uppermost surface of the wiring substrate 1 to protect the wiring patterns 30. The insulating layer 50 (white resist layer) also increases the reflectance of light from light emitting elements mounted on the wiring substrate 1 and reduces the lost amount in the light from the light emitting elements.

Figure 1C:
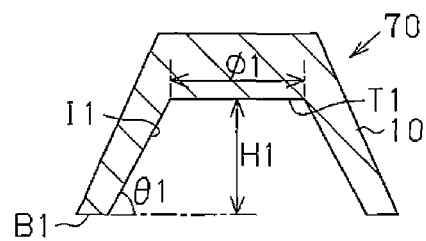
FIG. 1C is a partially enlarged cross-sectional view of the wiring substrate illustrated in FIG. 1B.

Further, the wiring substrate 1 includes a plurality of projections 70 projecting in a normal direction of an upper surface 50A of the insulating layer 50. The projections 70 are arranged in a peripheral portion of the substrate 10, which is located outward from where the mounting regions CA are arranged. In the first embodiment, the projections 70 are arranged along the four sides of the substrate 10. Each projection 70 is circular, for example, as viewed from above. As illustrated in FIG. 1B, each projection 70 rises in a thickness direction of the wiring substrate 1 the insulating layers 20 and 50, which are laminated on the substrate 10, together with the substrate 10. Accordingly, each projection 70 includes a rising part of the substrate 10 rising in the thickness direction toward the insulating layer 20 at a predetermined position of the substrate 10 and a rising part of each of the insulating layers 20 and 50 rising in the thickness direction at the rising part of the substrate 10. As illustrated in FIG. 1C, an inner top surface T1 of each projection 70 corresponds to a lower surface of the rising part of the substrate 10. The diameter $\phi 1$ of the inner top surface T1 may be approximately 0.6 to 0.7 mm, for example. The height H1 of the projection 70 from a bottom surface B1 of the projection 70 to the inner top surface T1 may be approximately 0.3 to 0.4 mm, for example. Here, an angle $\theta 1$ of the bottom surface B1 of the projection 70 and an inside wall I1 of the projection 70 may be approximately 60 to 70 degrees, for example. The peripheral portion of the substrate 10 is an example of an outer portion of the substrate located outward from where the first opening is arranged.

[Structure of Light Emitting Device]

The structure of a light emitting device 2 will now be described.

Figure 3A:
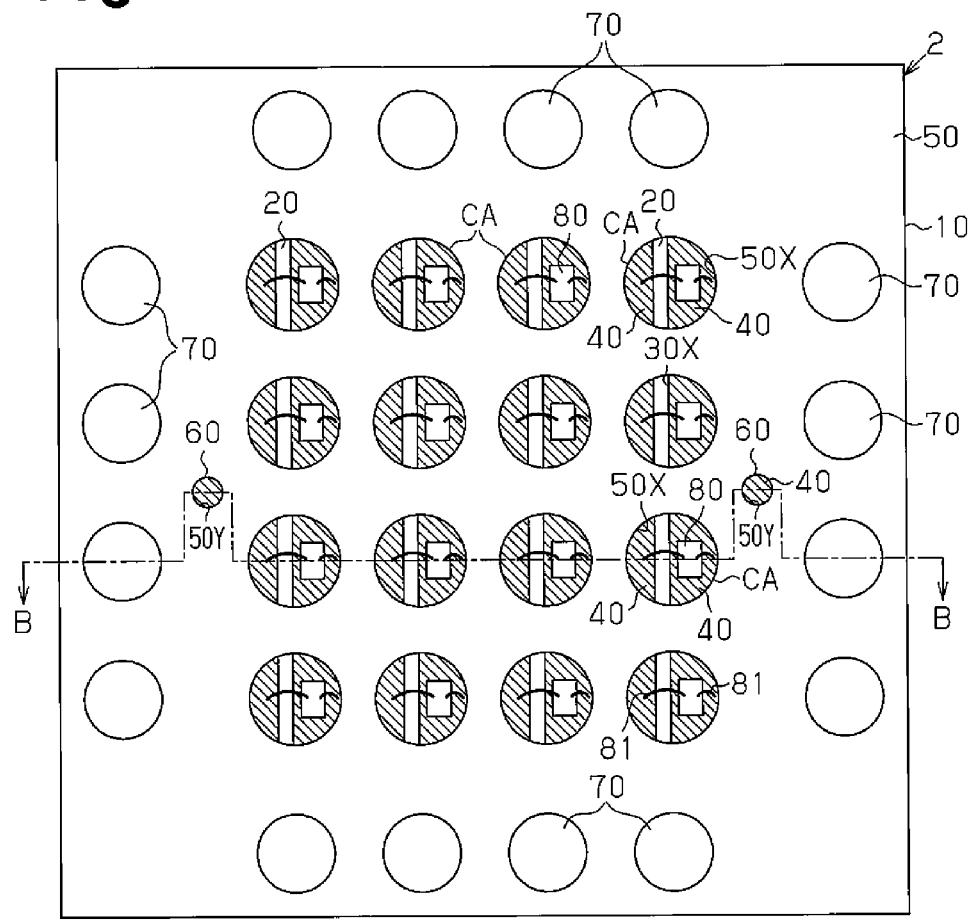
FIG. 3A is a schematic plan view illustrating a light emitting device including the wiring substrate of FIG. 1A.
Figure 3B:
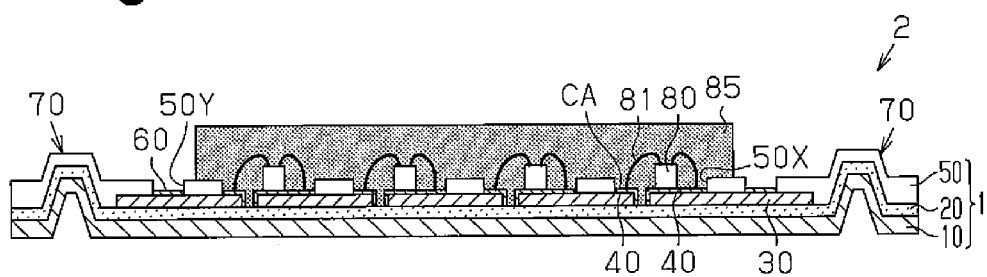
FIG. 3B is a schematic cross-sectional view of the light emitting device taken along line B-B in FIG. 3A.

As illustrated in FIG. 3B, the light emitting device 2 includes the wiring substrate 1, a plurality of (sixteen in FIG. 3A) light emitting elements 80 mounted on the wiring substrate 1, and a sealing resin 85 sealing the light emitting elements 80 and the like. The sealing resin 85 is not illustrated in FIG. 3A.

As illustrated in FIG. 3A, each light emitting element 80 is mounted on one of the mounting regions CA of the wiring substrate 1. For example, each light emitting element 80 is mounted on one of two parts of the metal layer 40 in the corresponding mounting region CA. Each light emitting element 80 includes two electrodes (not illustrated). One electrode is electrically connected to one part of the metal layer 40 in the mounting region CA by a bonding wire 81, and the other electrode is electrically connected to the other part of the metal layer 40 in the mounting region CA by a bonding wire 81. Accordingly, the two electrodes of the light emitting element 80 are electrically connected to the wiring patterns 30 (refer to FIG. 3B) by the bonding wires 81 and the metal layer 40. In the light emitting device 2 of the first embodiment, such a connection connects four of the light emitting elements 80 in series between the two electrode terminals 60, and four groups of the series-connected light emitting elements 80 are connected in parallel. The light emitting elements 80 are supplied with power via the electrode terminals 60 and the wiring patterns 30 from an external power supply (not illustrated) to emit light.

Examples of the light emitting element 80 include a light emitting diode (LED) and a vertical cavity surface emitting laser (VCSEL). Examples of the bonding wire 81 include an Au wire, an Al wire, and a Cu wire.

As illustrated in FIG. 3B, the sealing resin 85 is arranged on an upper surface of the wiring substrate 1 to seal the light emitting elements 80 and the bonding wires 81. An example of a material for the sealing resin 85 that may be used is a resin material in which a fluorescent body is contained in a silicone resin. Such a resin material containing a fluorescent body is applied to the light emitting elements 80 to allow for the use of a color mixture of the light emitted from the light emitting elements 80 and the light emitted from the fluorescent body. This allows for the color of the light emitted from the light emitting device 2 to be controlled in various manners.

In the wiring substrate 1, the projections 70, at which the substrate 10 and the insulating layers 20 and 50 laminated on the substrate 10 rise in the thickness direction, are formed in the peripheral portion of the wiring substrate 1. The rising parts of the substrate 10 and the insulating layers 20 and 50 increase the cross-sectional height of the entire wiring substrate 1. This improves the rigidity of the wiring substrate 1.

[Method for Manufacturing the Wiring Substrate]

A method for manufacturing the wiring substrate 1 will now be described with reference to FIGS. 4 to 7. FIGS. 4A, 5C, and 6D are schematic plan views illustrating a manufacturing process of the wiring substrate. Further, FIGS. 4B, 5A, 5B, 6A to 6C, 7A, and 7B are schematic cross-sectional views taken along line C-C in FIG. 4A and illustrating the manufacturing process of the wiring substrate. FIG. 7C is a schematic cross-sectional view of the wiring substrate taken along line A-A in FIG. 1A.

First, as illustrated in FIG. 4A, to manufacture the wiring substrate 1, a gang printing substrate (hereinafter simply referred to as the substrate) 10A is prepared. The substrate 10A includes a plurality of (three in FIG. 4A) wiring substrate formation areas C1. A structure corresponding to the wiring substrate 1 is formed in each wiring substrate formation area C1. Then, the substrate 10A is cut along a scribe line D1 by a dicing blade into structures corresponding to the wiring substrate 1. This obtains a plurality of wiring substrates 1 from the substrate 10A. In each wiring substrate 1, the substrate 10A forms the substrate 10 illustrated in FIGS. 1A and 1B. As described above, examples of a material for the substrate 10A (substrate 10) that may be used are metals having superior heat conductivity such as copper, aluminum, and iron and alloys containing at least one of these metals.

Subsequently, in the step illustrated in FIG. 4B, an insulating layer 20A is formed to entirely cover a first surface P1 of the substrate 10A. Subsequently, a metal foil such as a copper foil 30A is formed to entirely cover a first surface R1 of the insulating layer 20A. Here, a single-side copper-clad substrate in which the copper foil 30A is applied to one side of the insulating layer 20A (resin substrate) may be adhered to the substrate 10A. The insulating layer 20A ultimately functions as the insulating layer 20 illustrated in FIGS. 1A and 1B when the substrate 10A is cut along the scribe line D1.

Subsequently, in the step illustrated in FIG. 5A, a resist layer 90 including openings 90X at predetermined positions are formed in an upper surface of the copper foil 30A. The resist layer 90 covers the copper foil 30A at locations corresponding to the wiring patterns 30 and power lines 31 and 32 (refer to FIG. 5C), which are used to supply power for plating. Examples of the material for the resist layer 90 are photosensitive dry film resist and liquid photoresist (such as dry film resist and liquid resist of a novolac-based resin and an acrylic resin). For example, when the photosensitive dry film resist is used, a dry film is laminated on an upper surface of the copper foil 30A through thermal compression bonding. Then, the dry film is exposed and developed into a pattern forming the resist layer 90. When using the liquid photoresist, the resist layer 90 may be formed through a similar process.

Subsequently, in the step illustrated in FIG. 5B, the copper foil 30A is etched using the resist layer 90 illustrated in FIG. 5A as an etching mask to pattern the copper foil 30A into predetermined forms. As illustrated in FIG. 5C, this forms the wiring patterns 30 and the power lines 31 and 32 on the first surface R1 of the insulating layer 20A. In the first embodiment, the parallel strip-like wiring patterns 30 are formed. Further, a frame-shaped power line 31 is formed outward from the wiring substrate formation areas C1. The power lines 32 electrically connect the power line 31 to the wiring patterns 30. Accordingly, the wiring patterns 30 are electrically connected to one another by the power lines 31 and 32. In the description hereafter, the wiring patterns 30 and the power lines 31 and 32 are collectively referred to as a wiring layer 33. After completing the patterning of the copper foil 30A, the resist layer 90 illustrated in FIG. 5A is removed by, for example, an alkaline delamination liquid.

Subsequently, in the step illustrated in FIG. 6A, a resist layer 91 including openings 91X and 91Y at predetermined positions is formed on the first surface R1 of the insulating layer 20A. The openings 91X expose the wiring patterns 30 and the insulating layer 20A at locations corresponding to the mounting regions CA (refer to FIGS. 1A and 1B). Further, the openings 91Y expose the wiring patterns 30 at locations corresponding to the electrode terminals 60 (refer to FIGS. 1A and 1B). Examples of a material for the resist layer 91 are photosensitive dry film resist and liquid photoresist (such as dry film resist and liquid resist of a novolac-based resin and an acrylic resin). For example, when the photosensitive dry film resist is used, a dry film is laminated on an upper surface of the insulating layer 20A through thermal compression bonding. Then, the dry films is exposed and developed into a pattern forming the resist layer 91. When using the liquid photoresist, the resist layer 91 may be formed through a similar process.

Subsequently, in the step illustrated in FIG. 6B, electrolytic plating is performed on upper and side surfaces of the wiring patterns 30 using the resist layer 91 as a plating mask and the wiring layer 33 as a plating power layer. As a result, the upper surfaces and side surfaces of the wiring patterns 30 exposed from the openings 91X of the resist layer 91 undergo electrolytic plating to form the metal layers 40 covering the wiring patterns 30 corresponding to the mounting regions CA. Also, upper surfaces of the wiring patterns 30 exposed from the openings 91Y of the resist layer 91 are provided with the metal layers 40 by electrolytic plating. Thus, the electrode terminals 60 are formed by the metal layers 40. Meanwhile, when the metal layers 40 are Ni/Au layers, for example, a Ni layer and an Au layer are laminated in this order from the bottom on the surfaces of the wiring patterns 30 exposed from the openings 91X and 91Y of the resist layer 91.

Subsequently, in the step illustrated in FIG. 6C, the resist layer 91 illustrated in FIG. 6B is removed by, for example, an alkaline delamination liquid.

Subsequently, in the step illustrated in FIG. 6D, the power lines 32 illustrated in FIG. 5C are removed. For example, a resist layer (not illustrated) that exposes only the power lines 32 is formed on the insulating layer 20A. Subsequently, the wiring layer 33 is etched using the resist layer as an etching mask to remove the power lines 32. In this process, the power line 31 may be removed together with the power lines 32.

Subsequently, in the step illustrated in FIG. 7A, the insulating layer 50 is formed on the insulating layer 20A and the wiring patterns 30. The insulating layer 50 includes openings 50X and 50Y that expose the mounting regions CA (metal layer 40) and the electrode terminals 60 (metal layer 40), respectively. The insulating layer 50 may be formed by, for example, performing screen printing with a resin paste. Further, when using a photosensitive insulating resin as the material for the insulating layer 50, a resist layer for the insulating layer 50 is formed to cover the first surface R1 of the insulating layer 20A, the wiring patterns 30, the metal layers 40, and the power line 31. Then, photolithography is performed to expose and develop the resist layer to form the insulating layer 50 including the openings 50X and 50Y.

The formation of the insulating layer 50 exposes the metal layers 40 on the wiring patterns 30 from the openings 50X as the mounting regions CA. Thus, electrolytic plating does not have to be performed on the wiring patterns 30 after the formation of the insulating layer 50 to improve the contact characteristics. This suppresses deterioration of the plating liquid used when forming the metal layer 40. To be more specific, when plating (electrolytic plating or non-electrolytic plating) is performed to expose the wiring patterns 30 from the openings 50X after the formation of the insulating layer 50, a resin material or the like is eluted from the insulating layer 50 into the plating liquid. This may deteriorate the plating liquid and shorten the life. In contrast, with the manufacturing method of the present embodiment, the insulating layer 50 is not formed during the electrolytic plating. Since deterioration of the plating liquid may be suppressed, the life of the plating liquid is not shortened.

Subsequently, in the step illustrated in FIG. 7B, the projections 70 are formed in the peripheral portion of each wiring substrate formation area C1. The projections 70 may be formed through pressing or drawing, for example. When, for example, drawing the projections 70, the structure illustrated in FIG. 7A is inserted between a pressing member and a die. Then, by pressing predetermined parts of the substrate 10A from a second surface P2 (lower surface) of the substrate 10A, the substrate 10A and the insulating layers 20A and 50, which are formed on the substrate 10A, rise and form the projections 70.

The manufacturing process described above forms a structure corresponding to the wiring substrate 1 in each wiring substrate formation area C1.

Subsequently, in the step illustrated in FIG. 7C, the structure illustrated in FIG. 7B is cut along the scribe line D1. Accordingly, the substrate 10A is diced into the wiring substrates 1. This manufactures the wiring substrates 1 is manufactured. Here, the cutting also removes the power line 31 illustrated in FIG. 6D from the wiring substrate 1.

[Method for Manufacturing Light Emitting Device]

A method for manufacturing the light emitting device 2 will now be described with reference to FIGS. 8A and 8B.

FIGS. 8A and 8B are schematic cross-sectional views of the light emitting device 2 taken along line B-B in FIG. 3A and illustrating a manufacturing process.

In the step illustrated in FIG. 8A, the light emitting elements 80 are mounted by an adhesive (not illustrated) on the metal layer 40 in the mounting regions CA of the wiring substrate 1. Then, the electrodes of the light emitting elements 80 and the metal layers 40 are connected by the bonding wires 81 to electrically connect the light emitting elements 80 to the wiring patterns 30. Here, one of the electrodes of each light emitting element 80 is electrically connected to one part of the metal layer 40 in the mounting region CA by the bonding wire 81 while the other electrode of the light emitting element 80 is electrically connected to the other part of the metal layer 40 in the mounting region CA by the bonding wire 81.

Subsequently, in the step illustrated in FIG. 8B, the sealing resin 85 is formed to seal the light emitting elements 80, which are mounted on the wiring substrate 1, and the bonding wires 81. For example, when using a thermosetting resin as the sealing resin 85, the structure illustrated in FIG. 8A is arranged in a mold. Then, pressure (e.g., 5 to 10 MPa) is applied to the mold, and a resin is filled into the mold. The resin is heated to, for example, 180° C. and hardened to form the sealing resin 85. The sealing resin 85 may also be formed by a liquid resin potting. This manufactures the light emitting device 2 illustrated in FIGS. 3A and 3B.

The first embodiment has the advantages described below.

(1) In the peripheral portion of the wiring substrate 1, the substrate 10 and the insulating layers 20 and 50 laminated on the substrate 10 are raised to form the projections 70. Accordingly, the cross-sectional height of the entire wiring substrate 1 is increased by the rising parts of the substrate 10 and the insulating layers 20 and 50. This improves the rigidity of the wiring substrate 1. Accordingly, warping and deformation in the wiring substrate 1 is suppressed when heat contraction or the like occurs.

(2) The formation of the projections 70 increases the rigidity of the wiring substrate 1 even when the thickness of the substrate 10 is reduced. In other words, the substrate 10 may be reduced in thickness while increasing the rigidity of the wiring substrate 1. Thus, high heat conductivity may be obtained with the thin substrate 10. Here, the light emitting efficiency of the light emitting elements 80 (light emitting diodes) tends to decrease as the temperature of the light emitting elements 80 increases. Thus, the light emitting efficiency of the light emitting elements 80 may be prevented from decreasing by efficiently releasing the heat generated from the light emitting elements 80 with the substrate 10.

Further, the thin substrate 10 allows for a roll-to-roll manufacturing process to be performed. For example, the roll-to-roll manufacturing process may be performed in the manufacturing process illustrated in FIGS. 4A, 4B, and 5A to 5C. This improves productivity.

(3) After the formation of the metal layers 40 on the wiring patterns 30 through electrolytic plating, the insulating layer 50 including the openings 50X and 50Y, which expose the metal layer 40, is formed. In this case, the insulating layer 50 is not formed before the metal layer 40 is formed through electrolytic plating. This prevents deterioration of the plating liquid that would be caused by the insulating layer 50. Thus, the life of the plating liquid may be prolonged, and the plating liquid may be used continuously. This contributes to cost reduction.

(4) The metal layer 40 is formed through electrolytic plating. This reduces manufacturing costs as compared when forming the metal layer 40 through non-electrolytic plating.

Figures 9A, 9B:
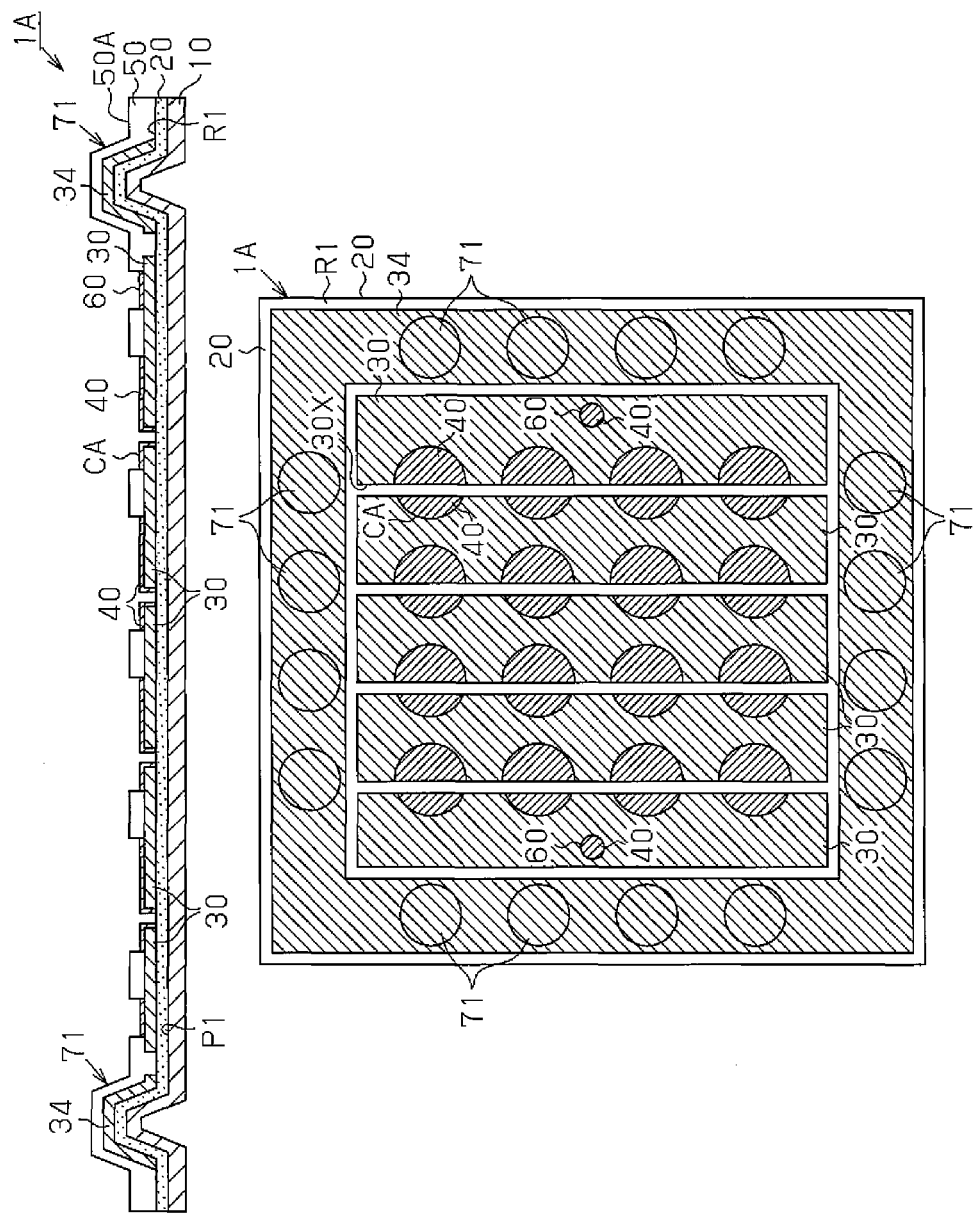
FIG. 9A is a schematic cross-sectional view illustrating a wiring substrate according to a second embodiment.
FIG. 9B is a schematic plan view illustrating the wiring substrate of FIG. 9A.

A second embodiment will now be described with reference to FIGS. 9A, 9B, and 10A to 10C. The description will center on differences from the first embodiment. FIG. 9A is a schematic cross-sectional view illustrating a wiring substrate 1A according to the second embodiment, and FIG. 9B is a schematic plan view illustrating the wiring substrate 1A without the outermost insulating layer 50. Like or same reference numerals are given to those components that are the same as the corresponding components illustrated in FIGS. 1 to 8. Such components will not be described in detail.

[Structure of Wiring Substrate]

As illustrated in FIG. 9B, a reinforcement layer 34 is formed in a peripheral portion of the first surface R1 of the insulating layer 20. The reinforcement layer 34 is frame-shaped and extends along the periphery of the substrate 10. As the material for the reinforcement layer 34, the same material as that for the wiring patterns 30 may be used. More specifically, examples of the material for the reinforcement layer 34 include copper and a copper alloy. The thickness of the reinforcement layer 34 may be approximately 15 to 150 μm, for example.

As illustrated in FIG. 9A, the insulating layer 50 is formed on the first surface R1 of the insulating layer 20. The insulating layer 50 covers the wiring patterns 30 and the upper surface and the side surfaces of the reinforcement layer 34 in parts other than the mounting regions CA and the electrode terminals 60.

The wiring substrate 1A includes a plurality of projections 71 projecting in a normal direction of the upper surface 50A of the insulating layer 50, which is the uppermost surface of the wiring substrate 1A. The projections 71 are arranged in the peripheral portion of the substrate 10. In the second embodiment, the projections 71 are formed in the peripheral portion of the substrate 10 where the reinforcement layer 34 is formed. Each projection 71 is formed so that the substrate 10 and the insulating layer 20, reinforcement layer 34, and insulating layer 50, which are laminated on the substrate 10, rise in a thickness direction of the wiring substrate 1A. Accordingly, each projection 71 includes a rising part rising from a predetermined position of the substrate 10 in the thickness direction toward the insulating layer 20, a rising part rising from the insulating layers 20 and 50 in the thickness direction at the rising part of the substrate 10, and a rising part of the reinforcement layer 34. Each projection 71 may have the same shape and size as the projection 70 when viewed from above.

[Method for Manufacturing Wiring Substrate]

A method for manufacturing the wiring substrate 1A will now be described. The wiring substrate 1A may be manufactured by a method similar to the method for manufacturing the wiring substrate 1 illustrated in FIGS. 4 to 7. The difference is in that the pattern of a wiring layer differs from the wiring layer formed in the manufacturing steps illustrated in FIGS. 5A to 5C. Thus, in the second embodiment, the manufacturing steps illustrated in FIGS. 10A to 10C are performed in lieu of the manufacturing steps of FIGS. 5A to 5C.

Figure 10A:
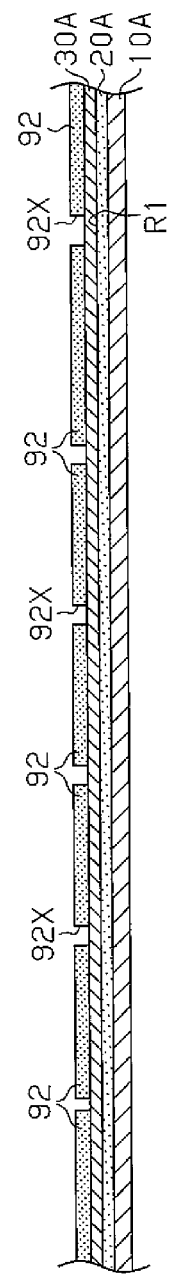
FIGS. 10A and 10B are schematic cross-sectional views illustrating states of a process for manufacturing the wiring substrate of FIG. 9A.
Figure 10B:
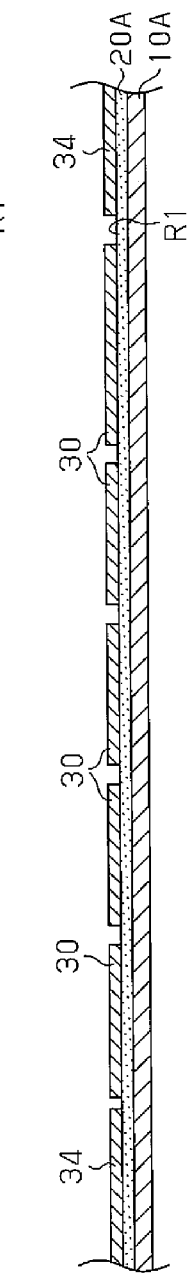
Figure 10C:
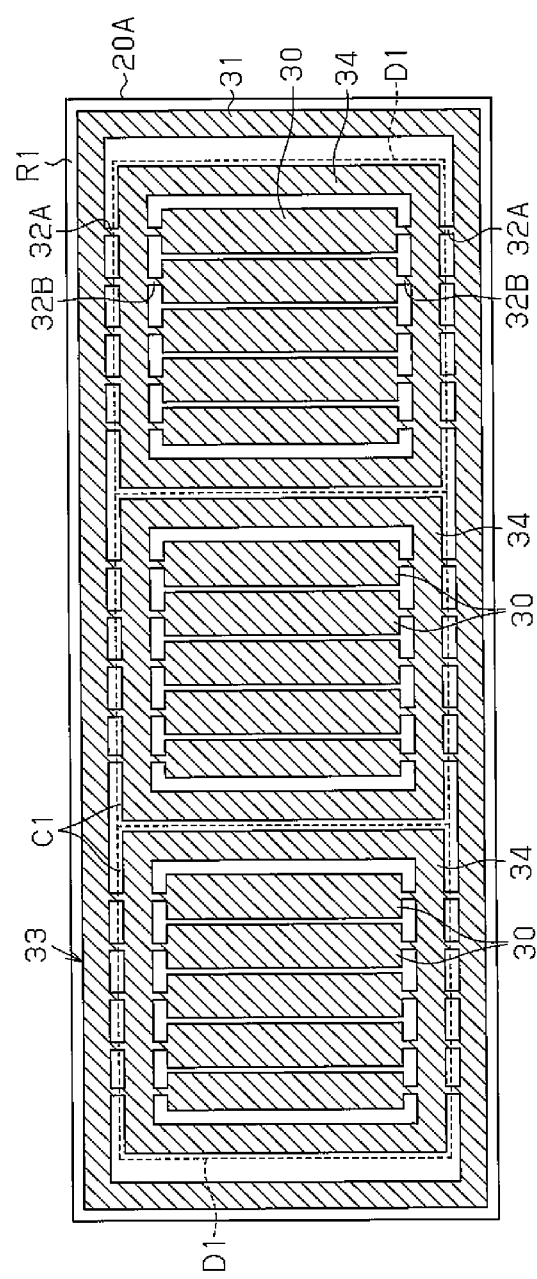
FIG. 10C is a schematic plan view illustrating a state of the process for manufacturing the wiring substrate of FIG. 9A.

In the step illustrated in FIG. 10A, a resist layer 92 including openings 92X at predetermined positions are formed on an upper surface of the copper foil 30A. The resist layer 92 covers the copper foil 30A at positions corresponding to the wiring patterns 30, the reinforcement layer 34, and power lines 31, 32A, and 32B, which are used to supply power for plating (refer to FIG. 10C). Examples of a material for the resist layer 92 are photosensitive dry film resist and liquid photoresist (such as dry film resist and liquid resist of a novolac-based resin and an acrylic resin). For example, when the photosensitive dry film resist is used, a dry film is laminated on an upper surface of the copper foil 30A through thermal compression bonding. Then, the dry film is exposed and developed into a pattern forming the resist layer 92. When using the liquid photoresist, the resist layer 92 may be formed through a similar process.

Subsequently, in the step illustrated in FIG. 10B, the copper foil 30A is etched using the resist layer 92 as an etching mask to pattern the copper foil 30A into a predetermined form. Accordingly, as illustrated in FIG. 10C, a wiring layer 33 including the desired number of wiring patterns 30, the reinforcement layers 34, and the power lines 31, 32A, and 32B is formed on the first surface R1 of the insulating layer 20A. In the second embodiment, the wiring patterns 30, the reinforcement layer 34 are formed along the periphery of each wiring substrate formation area C1, the frame-shaped power line 31 is formed outward from the wiring substrate formation area C1, the power lines 32A electrically connect the power line 31 to the reinforcement layer 34, and the power lines 32B electrically connect the reinforcement layers 34 to the wiring patterns 30. Accordingly, the wiring patterns 30 are all electrically connected to one another by the reinforcement layers 34 and the power lines 31, 32A, and 32B. After the patterning of the copper foil 30A is completed, the resist layer 92 illustrated in FIG. 10C is removed by, for example, an alkaline delamination liquid.

Then, the wiring substrate 1A is manufactured through steps similar to those of FIGS. 6A to 6D and 7A to 7C. However, in the step of removing the power lines illustrated in FIG. 6D, the power lines 32A and 32B are removed through etching.

The second embodiment has the following advantages in addition to advantages (1) to (4) of the first embodiment.

(5) The reinforcement layer 34 is formed in the portion where the projections 71 are formed. Thus, the cross-sectional height of the entire wiring substrate 1 may be further increased, and the rigidity of the wiring substrate 1 may be further improved. This further suppresses warping and deformation in the wiring substrate 1 when heat contraction or the like occurs.

(6) The wiring patterns 30 and the reinforcement layer 34 are formed at the same time. For example, in the second embodiment, the wiring patterns 30 and the reinforcement layer 34 are formed from the copper foil 30A at the same time during the etching step illustrated in FIG. 10B. Thus, even though the reinforcement layer 34 is added, the number of manufacturing steps may be kept low.

A third embodiment will now be described with reference to FIGS. 11A, 11B, and 12A to 12E. The description will center on differences from the second embodiment. Like or same reference numerals are given to those components that are the same as the corresponding components illustrated in FIGS. 1 to 10. Such components will not be described in detail.

[Structure of Wiring Substrate]

Figure 11A:
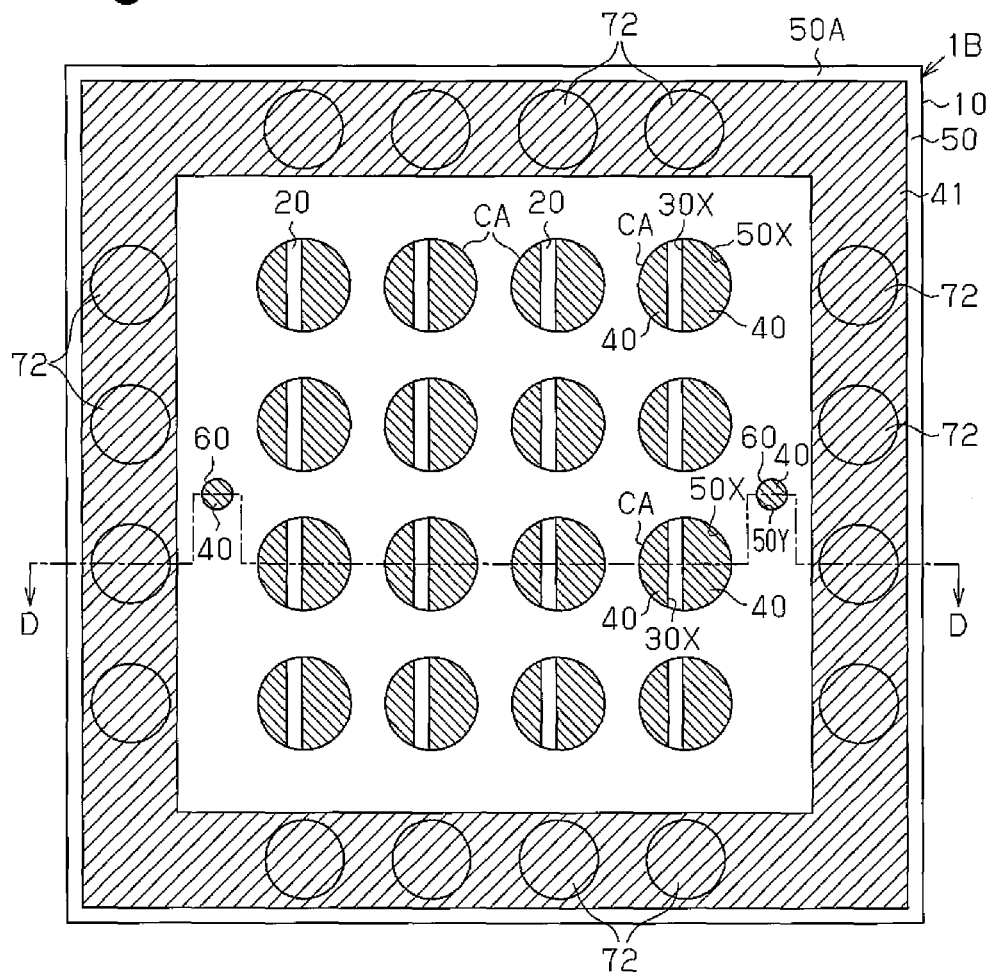
FIG. 11A is a schematic plan view illustrating a wiring substrate according to a third embodiment.
Figure 11B:
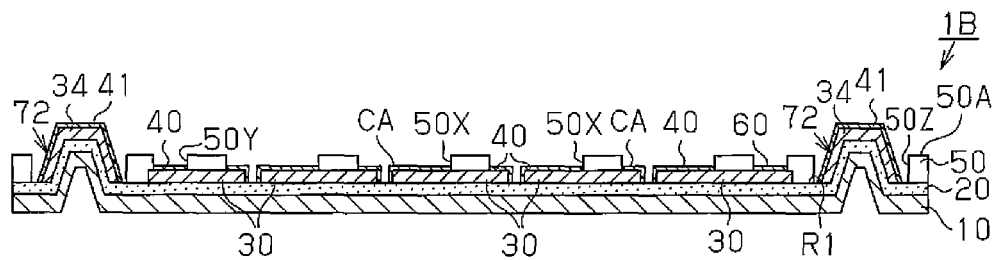
FIG. 11B is a schematic cross-sectional view of the wiring substrate taken along line D-D in FIG. 11A.

As illustrated in FIG. 11B, in a wiring substrate 1B according to the third embodiment, the reinforcement layer 34 is formed in a peripheral portion of the first surface R1 of the insulating layer 20. A metal layer 41 is formed to cover the upper surface and the side surfaces of the reinforcement layer 34. As illustrated in FIG. 11A, the metal layer 41 is frame-shaped and extends along the periphery of the substrate 10. Examples of the metal layer 41 are an Ag layer, a Ni/Ag layer (a metal layer in which a Ni layer and an Ag layer are laminated in this order from the bottom), and a Ni/Pd/Ag layer (a metal layer in which a Ni layer, a Pd layer, and an Ag layer are laminated in this order from the bottom). That is, the metal layer 41 preferably includes an outermost layer (uppermost layer) that is a metal layer made of a metal such as silver (Ag) having high light reflectance or an alloy containing the metal. Further, the material for the outermost layer of the metal layer 41 is preferably a metal or a metal alloy having a reflectance that is higher than or equal to the reflectance of the insulating layer 50.

The configuration of the metal layer 40 formed on the wiring pattern 30 may be the same or differ from that of the metal layer 41. In the third embodiment, the metal layer 40 and the metal layer 41 may both be Ag layers. The metal layer 41 is an example of a first metal layer, and the metal layer 40 is an example of a second metal layer.

The insulating layer 50 is formed on the first surface R1 of the insulating layer 20 to cover parts of the wiring patterns 30. The insulating layer 50 includes an opening 50Z, which exposes the metal layer 41, in addition to the openings 50X and 50Y. Thus, the metal layer 41, which has high light reflectance, is exposed from the uppermost surface of the wiring substrate 1B. The opening 50X is an example of a first opening, and the opening 50Z is an example of a second opening.

The wiring substrate 1B includes a plurality of projections 72 projecting from the upper surface 50A of the insulating layer 50, which is the uppermost surface of the wiring substrate 1B. The projections 72 are formed in the peripheral portion of the substrate 10. In the third embodiment, the projections 72 are formed in the peripheral portion of the substrate 10 where the reinforcement layer 34 and the metal layer 41 are formed. Each projection 72 is formed so that the substrate 10 and the insulating layer 20, reinforcement layer 34, and metal layer 41, which are laminated on the substrate 10, rise in a thickness direction of the wiring substrate 1B. Accordingly, each projection 72 includes a rising part rising from a predetermined position of the substrate 10 toward the insulating layer 20 in the thickness direction, a rising part rising from the insulating layer 20 in the thickness direction at the rising part of the substrate 10, a rising part of the reinforcement layer 34, and a rising part of the metal layer 41. Each projection 72 may have the same shape and size as the projection 70 when viewed from above.

[Method for Manufacturing Wiring Substrate]

A method for manufacturing the wiring substrate 1B will now be described. After the formation of the wiring patterns 30, the power lines 31, 32A, and 32B, and the reinforcement layer 34 on the insulating layer 20A in the manufacturing steps illustrated in FIGS. 10A to 10C, the manufacturing steps illustrated below are performed.

In the step illustrated in FIG. 12A, a resist layer 93 is formed on the first surface R1 of the insulating layer 20A. The resist layer 93 includes openings 93X, 93Y, and 93Z at predetermined positions. Each opening 93X exposes the wiring patterns 30 and the insulating layer 20A at a position corresponding to one of the mounting regions CA (refer to FIGS. 11A and 11B). Each opening 93Y exposes the wiring pattern 30 at a position corresponding to the electrode terminal 60 (refer to FIGS. 11A and 11B). The opening 93Z exposes the reinforcement layer 34. Examples of the material for the resist layer 93 that may be used are photosensitive dry film resist and liquid photoresist (such as dry film resist and liquid resist of a novolac-based resin and an acrylic resin). For example, when the photosensitive dry film resist is used, a dry film is laminated on an upper surface of the insulating layer 20A by thermal compression bonding. Then, the dry film is exposed and developed to pattern the resist layer 93. When using the liquid photoresist, the resist layer 93 may be formed through a similar process.

Subsequently, in the step illustrated in FIG. 12B, electrolytic plating that uses the resist layer 93 as a plating mask and the wiring patterns 30 and the reinforcement layer 34 as plating power layers is performed on the surfaces (upper surfaces and side surfaces) of the wiring patterns 30 and the reinforcement layer 34. As a result, the upper surfaces and side surfaces of the wiring patterns 30 exposed from the openings 93X of the resist layer 93 are electrolytically plated to form the metal layers 40 (here, Ag layers) on the wiring patterns 30 corresponding to the mounting regions CA. The electrolytic plating also forms the metal layers 40 (here, Ag layers) on the upper surfaces of the wiring patterns 30 exposed from the openings 93Y of the resist layer 93. This forms the electrode terminals 60 with the metal layers 40. Further, the upper surface and side surfaces of the reinforcement layer 34 exposed from the opening 93Z of the resist layer 93 are electrolytically plated to form the metal layer 41 (here, Ag layer) that covers the reinforcement layer 34. Thus, the frame-like metal layer 41 is formed along the periphery of the wiring substrate formation area C1. Then, the resist layer 93 is removed by, for example, an alkaline delamination liquid, and the power lines 32A and 32B (refer to FIG. 10C) are removed by etching. This electrically separates the wiring patterns 30 and the reinforcement layers 34 and electrically separates the respective wiring patterns 30.

Subsequently, in the step illustrated in FIG. 12C, the insulating layer 50 is formed on the insulating layer 20A and the wiring patterns 30. The insulating layer 50 includes the openings 50X, 50Y, and 50Z that expose the mounting regions CA (metal layers 40), the electrode terminals 60 (metal layers 40), and the metal layer 41, respectively. The insulating layer 50 may be formed by, for example, performing screen printing with a resin paste. Also, when using a photosensitive insulating resin as the material for the insulating layer 50, a resist layer for the insulating layer 50 is formed to cover the first surface R1 of the insulating layer 20A, the wiring patterns 30, the metal layers 40 and 41, and the power line 31. Then, photolithography is performed to expose and develop the resist layer and form the insulating layer 50 including the openings 50X, 50Y, and 50Z.

Subsequently, in the step illustrated in FIG. 12D, the projections 72 are formed in the peripheral portion of each wiring substrate formation area C1. The projections 72 may be formed through pressing or drawing, for example, in the same manner as the projections 70. When the projections 72 are formed through drawing, the structure illustrated in FIG. 12C is inserted between a pressing member and a die. Then, predetermined parts of the substrate 10A are pressed from the second surface P2 (lower surface) of the substrate 10A to raise the substrate 10A in the thickness direction toward the insulating layer 20A to form the projections 72. The above manufacturing steps forms a structure corresponding to the wiring substrate 1B in each wiring substrate formation area C1.

Subsequently, in the step illustrated in FIG. 12E, the structure illustrated in FIG. 12D is cut along the scribe line D1. Accordingly, the substrate 10A is diced into the wiring substrates 1B. This manufactures the wiring substrates 1B.

The third embodiment has the following advantages in addition to advantages (1) to (6) of the first and second embodiments.

(7) The projections 72 are formed where the insulating layer 50 is not formed. Thus, even if the insulating layer 50 is deformed when performing pressing to form the projections 72, for example, delamination of the insulating layer 50 from the insulating layer 20 or the like is suppressed. Also, the insulating layer 50 includes the opening 50Z that exposes the metal layer 41. Thus, the metal layer 41, which has high light reflectance, and the insulating layer 50, which has high light reflectance, are exposed from the uppermost surface of the wiring substrate 1B. This increases the reflectance of the light from the light emitting elements mounted on the wiring substrate 1B and reduces the lost amount in the light from the light emitting elements.

(8) The metal layers 40 and the metal layer 41 are formed with the same configuration (same material). Thus, the metal layers 40 and the metal layer 4 may be formed at the same time. Thus, even though the metal layer 41 is added, the number of manufacturing steps may be kept low.

It should be apparent to those skilled in the art that the aforementioned embodiments may be embodied in many other specific forms without departing from the spirit or scope of the invention. Particularly, it should be understood that the invention may be embodied in the following forms.

In the first embodiment, the power lines 32 formed outward from the wiring substrate formation areas C1 are removed before dicing is performed to obtain the wiring substrates 1. However, the step of removing the power lines 32 (refer to FIG. 6D) may be omitted. Even in this case, the power lines 32 are separated from the power line 31 when cutting the substrate 10A along the scribe line D1 (refer to FIG. 7C). Thus, as illustrated in FIG. 13A, even when the power lines 32 remain in each wiring substrate 1, the wiring patterns 30, which are connected to the power lines 32, are separated from each other. Accordingly, even when the removal of the power lines 32 is omitted, the performance of the wiring substrate 1 is not affected.

In the same manner, in the second and third embodiments, the removal of the power lines 32A, which connect the power line 31 to the reinforcement layers 34, may be omitted. However, the power lines 32B that connect the reinforcement layers 34 to the wiring patterns 30 are removed.

In the second and third embodiments, the frame-shaped reinforcement layer 34 is formed in the peripheral portion of the insulating layer 20. However, the shape and location of the reinforcement layer 34 as viewed from above are not particularly limited. For example, as illustrated in FIGS. 13B to 13D, strip-like reinforcement layers 34A extending along two opposite ones of the four sides of the substrate 10 may be formed in the peripheral portion of the insulating layer 20. Further, as illustrated in FIG. 13E, strip-like reinforcement layers 34A extending along the four sides of the substrate 10 may be formed in the peripheral portion of the insulating layer 20. The shape of the metal layer 41 may be changed in correspondence with the shape of the reinforcement layers 34 and 34A.

The number, location, and shape of the projections 70, 71, or 72 in each of the embodiments are not particularly limited.

For example, although the projections 71 or 72 are formed in the peripheral portion of the substrate 10 where the reinforcement layer 34 is formed in each of the second and third embodiments, the projections 71 may also be formed in the peripheral portion of the substrate 10 where the reinforcement layer 34A is not formed as illustrated in FIG. 13B. In the same manner, although not illustrated in the drawings, the projections 72 may be formed in the peripheral portion of the substrate 10 where the reinforcement layer 34A and the metal layer 41 are not formed.

The projections 70, 71, or 72 may be formed at only two opposite ones of the four sides of the substrate 10. As illustrated in FIG. 13C, when the reinforcement layers 34A are formed at only two of the substrate 10, it is preferable that the projections 71 (or projections 72) be formed at the two sides where the reinforcement layers 34A are formed.

As illustrated in FIGS. 13D and 13E, projections 71A, which are strip-shaped as viewed from above, may be formed extending along the sides of the substrate 10 in the peripheral portion of the substrate 10. For example, the projections 71A may be formed at two opposite ones of the four sides of the substrate 10 as illustrated in FIG. 13D. Alternatively, the projections 71A may be formed at each of the four sides of the substrate 10 as illustrated in FIG. 13E. Although not illustrated in the drawings, the projections 70 and 72 may also be strip-shaped as viewed from above.

As illustrated in FIG. 13F, a projection 70A that is frame-shaped as viewed from above and extends along the periphery of the substrate 10 may be formed in the peripheral portion of the substrate 10. Although not illustrated in the drawings, the projection 71 or 72 may also be frame-shaped as viewed from above.

The projections 71, 71A, or 72 may be formed in combination with the reinforcement layers 34 or 34A (and the metal layer 41) of various shapes.

In the second and third embodiments, the wiring patterns 30 and the reinforcement layer 34 are made of the same material (here, copper). However, the material is not limited in such a manner, and the wiring patterns 30 and the reinforcement layer 34 may be made of different materials. In this case, after forming the wiring patterns 30 by etching of the copper foil 30A, the reinforcement layer 34 is formed by a semi-additive process or the like, for example.

In the third embodiment, the metal layers 40 and the metal layer 41 are made of the same material (here, Ag). The material is not limited in such a manner, and the metal layers 40 and the metal layer 41 may be made of different materials. Further, the metal layers 40 and the metal layer 41 may have different configurations. For example, the metal layers 40 may be a Ni/Au layer, and the metal layer 41 may be an Ag layer. When the metal layers 40 and the metal layer 41 are made of different materials, a resist layer is formed exposing only the wiring patterns 30 corresponding to the mounting regions CA and the electrode terminals 60, and electrolytic plating is performed on surfaces of the wiring patterns 30 using the resist layer as a plating mask. This forms the metal layers 40 on the wiring patterns 30. Subsequently, after removal of the resist layer, another resist layer that exposes only the reinforcement layer 34 is formed, and electrolytic plating is performed on a surface of the reinforcement layer 34 using the resist layer as a plating mask. This forms the metal layer 41 on the reinforcement layer 34.

In the above embodiments, after forming each wiring substrate 1, the light emitting element 80 is mounted on the metal layer 40 of each wiring substrates 1. Instead, the light emitting elements 80 may be mounted on the metal layers 40 before the wiring substrates 1 are separated from one another, that is, in a state illustrated in FIG. 7B. In this case, after the light emitting elements 80 are sealed by the sealing resin 85, the substrate 10A is cut along the scribe line D1 to obtain each light emitting device 2.

Figure 14:
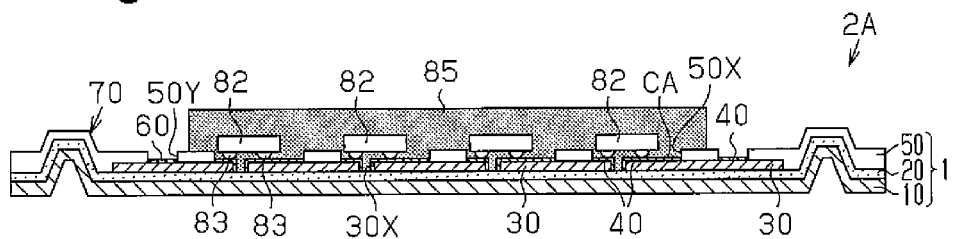
FIG. 14 is a schematic cross-sectional view illustrating a modified example of a wiring substrate.

In the above embodiments, wire bonding is performed to mount the light emitting element 80 on the metal layer 40, which covers the wiring patterns 30 exposed from the openings 50X of the insulating layer 50. Alternatively, as illustrated in FIG. 14, flip chip bonding may be performed to mount the light emitting elements 82 on the metal layers 40. In this case, each light emitting element 82 is mounted on the metal layers 40 formed on two opposite sides of an opening 30X in the mounting region CA. A bump 83 is formed on a circuit formation surface (lower surface in FIG. 14) of the light emitting element 82, and is flip-chip-bonded with one of the metal layers 40 in the mounting region CA while another bump 83 is flip-chip-bonded with the other metal layer 40 in the mounting region CA.

In each of the embodiments, the metal layer 40 may be formed to entirely cover the wiring patterns 30.

In each of the first and second embodiments, the insulating layer 50 is formed after the metal layers 40 are formed. Alternatively, after the formation of the insulating layer 50 including the openings 50X and 50Y, electrolytic plating may be performed on the wiring patterns 30, which are exposed from the openings 50X and 50Y, to form the metal layers 40. In this case, the projections 70 or 71 may be formed before or after the formation of the metal layers 40.

In the third embodiment, the insulating layer 50 is formed after the formation of the metal layers 40 and 41.

Alternatively, after the formation of the insulating layer 50 including the openings 50X, 50Y, and 50Z, the metal layers 40 and 41 may be formed, for example. In this case, after the formation of the insulating layer 50, electrolytic plating is performed on the wiring patterns 30, which are exposed from the openings 50X and 50Y, to form the metal layers 40. Further, electrolytic plating is performed on the reinforcement layer 34, which is exposed from the opening 50Z, to form the metal layer 41.

In the above embodiments, the metal layers 40 may be omitted.

The shape of the openings 50X and 50Y as viewed from above in the above embodiments does not have to be circular and may be polygonal, for example, tetragonal, pentagonal, or hexagonal shape, or oval.

The wiring substrate in each of the above embodiments is applied to a light emitting device. However, for example, a component other than a light emitting element may be mounted on the wiring substrate 1 or 1A of the first or second embodiment.

[First Mounting Example of Light Emitting Device]

Figure 15A:
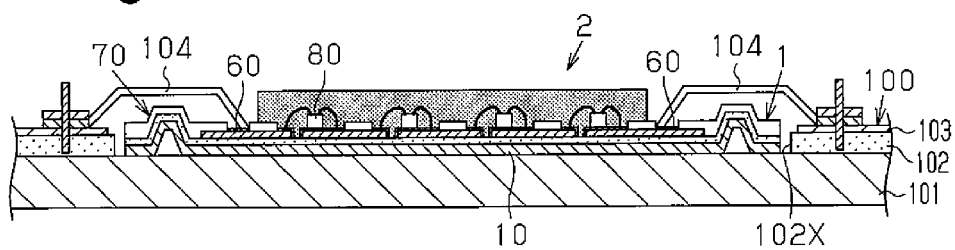
FIG. 15A is a schematic cross-sectional view illustrating a mounting example of the light emitting device.
Figure 15B:
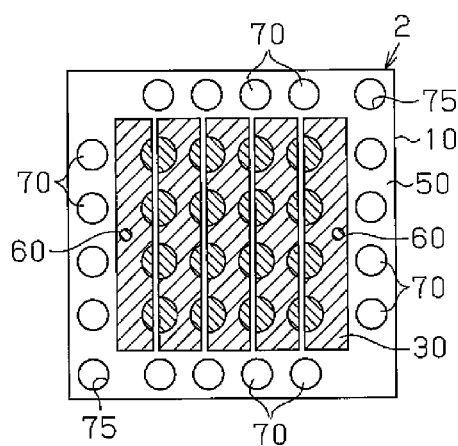
FIG. 15B is a schematic plan view illustrating a mounting example of the light emitting device.

FIG. 15A illustrates an application example of the light emitting device 2 formed by mounting the light emitting elements 80 on the wiring substrate 1 of the first embodiment. The light emitting device 2 is mounted on an mounting substrate 100. FIG. 15B illustrates an example of the structure of the light emitting device 2 mounted on the mounting substrate 100 as viewed from above. FIG. 15B does not illustrate the light emitting elements 80, the bonding wires 81, and the sealing resin 85.

The mounting substrate 100 includes a metal layer 101, an insulating layer 102 formed on an upper surface of the metal layer 101, and a wiring pattern 103 formed on an upper surface of the insulating layer 102. The insulating layer 102 includes an opening 102X exposing part of the metal layer 101. The light emitting device 2 is mounted on the metal layer 101 at a location exposed from the opening 102X. For example, the substrate 10, which is located on a lower surface of the light emitting device 2, is fixed to the metal layer 101 by an adhesive or screws.

As illustrated in FIG. 15B, when the light emitting device 2 is fastened by screws, the light emitting device 2 includes through holes 75 for screws. In the light emitting device 2 of the present example, two through holes 75 are arranged on a diagonal line of the substrate 10. Although not illustrated in the drawings, the through holes 75 extend through the substrate 10 and the insulating layers 20 and 50 illustrated in FIG. 3B. In this case, the mounting substrate 100 illustrated in FIG. 15A also includes corresponding screw holes (not illustrated).

The electrode terminals 60 of the light emitting device 2 mounted on the mounting substrate 100 are electrically connected to the wiring pattern 103 of the mounting substrate 100 via spring-shaped connection terminals 104 (lead pins in FIG. 15A).

In such a structure, the substrate 10, which functions as a heat release plate for the light emitting device 2, is fixed to the metal layer 101 of the mounting substrate 100. Thus, heat generated by the light emitting device 2 may be transferred to the metal layer 101. In this case, the rigidity of the wiring substrate 1 is increased by the formation of the projections 70. This suppresses the occurrence of warping and deformation in the light emitting device 2. Thus, satisfactory adhesion may be obtained between the substrate 10 and the metal layer 101. This efficiently transfers the heat generated by the light emitting device 2 to the metal layer 101.

[Second Mounting Example of Light Emitting Device]

Figure 16:
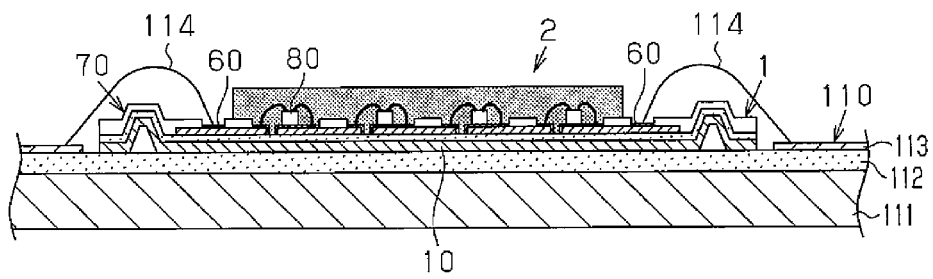
FIG. 16 is a schematic cross-sectional view illustrating a mounting example of the light emitting device.

FIG. 16 illustrates the cross-sectional structure when the light emitting device 2 is mounted on a mounting substrate 110.

The mounting substrate 110 includes a metal layer 111, an insulating layer 112 formed on an upper surface of the metal layer 111, and a wiring pattern 113 formed on an upper surface of the insulating layer 112.

In this mounting example, the insulating layer 112 does not include an opening exposing the metal layer 111, and the light emitting device 2 is mounted on the insulating layer 112. For example, the substrate 10, which is located on a lower surface of the light emitting device 2, is fixed to the insulating layer 112 by an adhesive or screws. Even in such a structure, when the insulating layer 112 is thin, the heat generated from the light emitting device 2 may be transferred to the metal layer 111 through the insulating layer 112.

In this mounting example, bonding wires 114 electrically connect the electrode terminals 60 of the light emitting device 2, which are mounted on the mounting substrate 110, and the wiring pattern 113 of the mounting substrate 110.

The invention claimed is:

1. A wiring substrate comprising:
a substrate;
a first insulating layer formed on the substrate;
a plurality of wiring patterns formed on a first surface of the first insulating layer;
a second insulating layer formed on the first surface of the first insulating layer, wherein the second insulating layer covers the wiring patterns and includes a first opening that partially exposes adjacent ones of the wiring patterns as a pad; and
a projection formed in an outer portion of the substrate located outward from where the first opening is arranged, wherein the projection includes:
a rising part of the substrate rising in a thickness direction of the substrate toward the first insulating layer; and
a rising part of the first insulating layer and a rising part of the second insulating layer, wherein the rising parts of the first and second insulating layers rise in the thickness direction at the rising part of the substrate.

2. The wiring substrate according to claim 1, further comprising a reinforcement layer arranged in the outer portion of the substrate and made of a metal or a metal alloy, wherein the projection is formed in the outer portion of the substrate where the reinforcement layer is formed.

3. The wiring substrate according to claim 2, further comprising a first metal layer covering the reinforcement layer, wherein
the second insulating layer includes a second opening that exposes the first metal layer, and the first metal layer includes an outermost layer made of a metal or a metal alloy having a higher reflectance than the reinforcement layer.

4. The wiring substrate according to claim 3, further comprising a second metal layer covering the wiring patterns exposed from the first opening, wherein the first metal layer and the second metal layer are made of the same material.

5. The wiring substrate according to claim 3, wherein the outermost layer of the first metal layer is a metal layer made of silver or a silver alloy.

6. The wiring substrate according to claim 2, wherein the wiring patterns and the reinforcement layer are made of the same material.

7. The wiring substrate according to claim 1, wherein the projection is circular when viewed from above.

8. The wiring substrate according to claim 1, wherein the projection is strip- shaped when viewed from above.

9. The wiring substrate according to claim 1, wherein the projection is frame- shaped when viewed from above.

10. The wiring substrate according to claim 1, wherein the substrate is tetragonal when viewed from above, and the projection is arranged along a side of the substrate.

11. The wiring substrate according to claim 1, wherein the substrate is made of a metal.

12. A light emitting device comprising:
a substrate;
a first insulating layer formed on the substrate;
a plurality of wiring patterns formed on a first surface of the first insulating layer;
a second insulating layer formed on the first surface of the first insulating layer, wherein the second insulating layer covers the wiring patterns and includes a first opening that partially exposes adjacent ones of the wiring patterns as a pad;
a projection formed in an outer portion of the substrate located outward from where the first opening is arranged, wherein the projection includes:
a rising part of the substrate rising in a thickness direction of the substrate toward the first insulating layer; and
a rising part of the first insulating layer and a rising part of the second insulating layer, wherein the rising parts of the first and second insulating layers rise in the thickness direction at the rising part of the substrate;
a light emitting element mounted on the pad; and
a sealing resin sealing the light emitting element.

13. A method for manufacturing a wiring substrate, the method comprising:
forming a first insulating layer on a substrate;
forming a wiring layer including a plurality of wiring patterns on a first surface of the first insulating layer;
forming a second insulating layer on the wiring patterns, wherein the second insulating layer includes a first opening that partially exposes adjacent ones of the wiring patterns as a pad; and
forming a projection by raising a part of the substrate in a thickness direction in an outer portion of the substrate located outward from where the first opening is arranged, wherein the projection includes:
a rising part of the substrate rising in a thickness direction of the substrate toward the first insulating layer; and
a rising part of the first insulating layer and a rising part of the second insulating layer, wherein the rising parts of the first and second insulating layers rise in the thickness direction at the rising part of the substrate.

14. The method according to claim 13, wherein:
the forming a wiring layer includes
forming a resist layer on a metal foil formed on the first surface of the first insulating layer, wherein the resist layer includes an opening, and
etching the metal foil using the resist layer as a mask to form the wiring layer;
the wiring layer includes the wiring patterns, a reinforcement layer formed in the outer portion of the substrate, and a power line used for electrolytic plating; and
the forming a projection includes forming the projection in the outer portion of the substrate where the reinforcement layer is formed.

15. The method according to claim 14, further comprising performing, before forming the second insulating layer, electrolytic plating using the wiring layer as a power supplying layer to form a first metal layer on the reinforcement layer and a second metal layer on the wiring patterns for the pad, wherein
the first metal layer is made of a metal or a metal alloy having a higher reflectance than the reinforcement layer,
the second metal layer and the first metal layer are made of the same material, and
the forming the second insulating layer includes forming the second insulating layer that includes the first opening and a second opening, which exposes the first metal layer.

16. The method according to claim 13, wherein the forming a projection includes forming a circular projection as viewed from above.

17. The method according to claim 13, wherein the forming a projection includes forming a strip-shaped projection as viewed from above.

18. The method according to claim 13, wherein the forming a projection includes forming a frame-shaped projection as view from above.

19. The method according to claim 13, wherein
the substrate is tetragonal as viewed from above, and
the forming a projection includes forming the projection along a side of the substrate.

20. The method according to claim 13, wherein the substrate is made of a metal.

* * * * *

UNITED STATES PATENT AND TRADEMARK OFFICE
CERTIFICATE OF CORRECTION

PATENT NO. : 9,257,354 B2  
APPLICATION NO. : 13/655802  
DATED : February 9, 2016  
INVENTOR(S) : Hiroshi Shimizu et al.

Page 1 of 1

It is certified that error appears in the above-identified patent and that said Letters Patent is hereby corrected as shown below:

In the Claims

In Col. 17, line 17, Claim 8, delete "strip- shaped" and insert -- strip-shaped --, therefor.

In Col. 17, line 19, Claim 9, delete "frame- shaped" and insert -- frame-shaped --, therefor.

Signed and Sealed this
Tenth Day of May, 2016

Michelle K. Lee
*Director of the United States Patent and Trademark Office*